(12) United States Patent
Dutta et al.

(10) Patent No.: US 9,214,240 B2
(45) Date of Patent: Dec. 15, 2015

(54) DYNAMIC ERASE DEPTH FOR IMPROVED ENDURANCE OF NON-VOLATILE MEMORY

(71) Applicant: SanDisk Technologies Inc., Plano, TX (US)

(72) Inventors: Deepanshu Dutta, Santa Clara, CA (US); Chun-Hung Lai, Kamakura (JP); Shih-Chung Lee, Yokohama (JP); Ken Oowada, Fujisawa (JP); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 77 days.

(21) Appl. No.: 14/195,265

(22) Filed: Mar. 3, 2014

(65) Prior Publication Data
US 2014/0247666 A1    Sep. 4, 2014

Related U.S. Application Data

(60) Provisional application No. 61/772,250, filed on Mar. 4, 2013.

(51) Int. Cl.
*G11C 16/04* (2006.01)
*G11C 16/14* (2006.01)
*G11C 16/34* (2006.01)
(Continued)

(52) U.S. Cl.
CPC ............ *G11C 16/14* (2013.01); *G11C 11/5635* (2013.01); *G11C 16/16* (2013.01); *G11C 16/349* (2013.01); *G11C 16/3427* (2013.01); *G11C 16/3445* (2013.01); *G11C 11/5628* (2013.01)

(58) Field of Classification Search
CPC ........ G11C 16/14; G11C 16/26; G11C 16/16; G11C 16/3445; G11C 16/3427
USPC ............. 365/185.17, 185.19, 185.21, 185.22, 365/185.23, 185.24, 185.29, 218
See application file for complete search history.

(56) References Cited

U.S. PATENT DOCUMENTS

| 6,643,181 | B2 | 11/2003 | Sofer et al. |
| 6,819,590 | B2 | 11/2004 | Goda et al. |
| 6,928,001 | B2 | 8/2005 | Avni et al. |

(Continued)

OTHER PUBLICATIONS

International Search Report & The Written Opinion of the International Searching Authority dated Sep. 11, 2014, International Application No. PCT/US2014/019995.

(Continued)

*Primary Examiner* — Gene Auduong
(74) *Attorney, Agent, or Firm* — Vierra Magen Marcus LLP

(57) ABSTRACT

Improving endurance for non-volatile memory by dynamic erase depth is disclosed. A group of memory cells are erased. Then, at least some of the erased memory cells are programmed. Programming the memory cells typically impacts the erase threshold distribution of those memory cells that were intended to stay erased. The erase depth of the next erase can be adjusted based on how the program operation affects the erase threshold distribution. As one example, the upper tail of the erase distribution is measured after programming. The higher the upper tail, the shallower the next erase, in one embodiment. This helps to improve endurance. In one embodiment, the erase depth is adjusted by determining a suitable erase verify level. Rather than (or in addition to) adjusting the erase verify level, the number of erase pulses that are performed after erase verify passes can be adjusted to adjust the erase depth.

20 Claims, 27 Drawing Sheets

(51) Int. Cl.
    *G11C 16/16*     (2006.01)
    *G11C 11/56*     (2006.01)

(56) References Cited

U.S. PATENT DOCUMENTS

| | | |
|---|---|---|
| 7,468,926 B2 | 12/2008 | Shappir et al. |
| 7,606,100 B2 | 10/2009 | Hemink et al. |
| 7,957,189 B2 | 6/2011 | Avraham et al. |
| 8,036,044 B2 | 10/2011 | Dong et al. |
| 8,130,551 B2 | 3/2012 | Oowada et al. |
| 8,179,720 B2 * | 5/2012 | Fukuda et al. ............ 365/185.03 |
| 8,891,308 B1 * | 11/2014 | Ou et al. ................... 365/185.17 |
| 8,958,249 B2 * | 2/2015 | Dutta et al. .............. 365/185.17 |
| 2005/0057997 A1 | 3/2005 | Mitani et al. |
| 2007/0104004 A1 | 5/2007 | So et al. |
| 2007/0247918 A1 | 10/2007 | Shinagawa et al. |
| 2008/0117688 A1 | 5/2008 | Park et al. |
| 2009/0268516 A1 | 10/2009 | Murin et al. |
| 2011/0242899 A1 | 10/2011 | Oowada et al. |
| 2014/0003147 A1 | 1/2014 | Dutta et al. |

OTHER PUBLICATIONS

Notice of Allowance dated Oct. 10, 2014, U.S. Appl. No. 14/195,282, filed Mar. 3, 2014.
U.S. Appl. No. 14/195,282, filed Mar. 3, 2014.
Preliminary Amendment for U.S. Appl. No. 14/195,282, filed Mar. 3, 2014, filed Apr. 9, 2014.

* cited by examiner

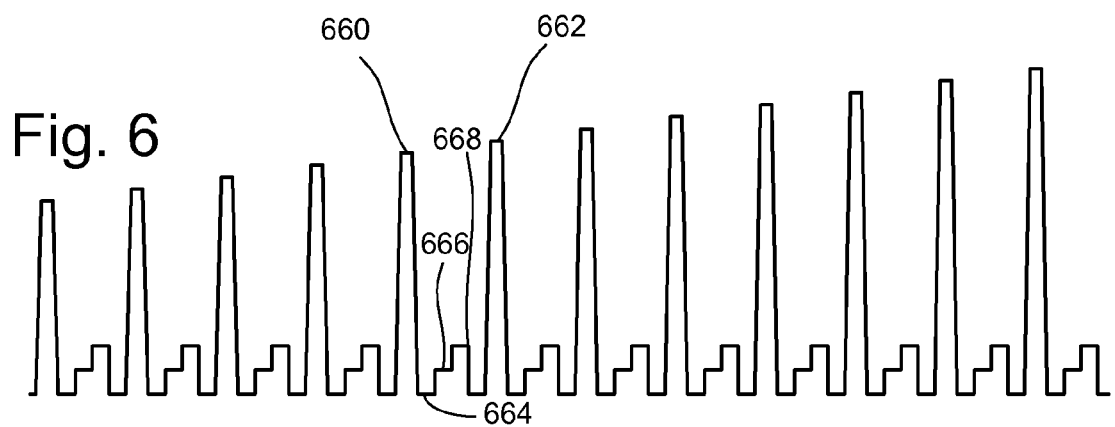
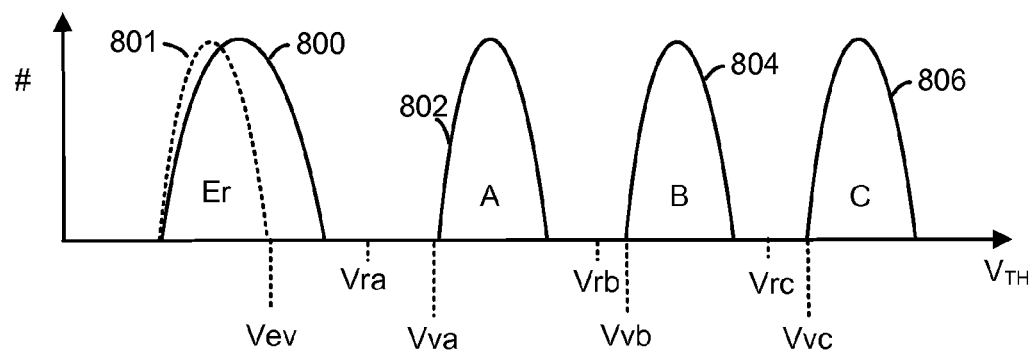

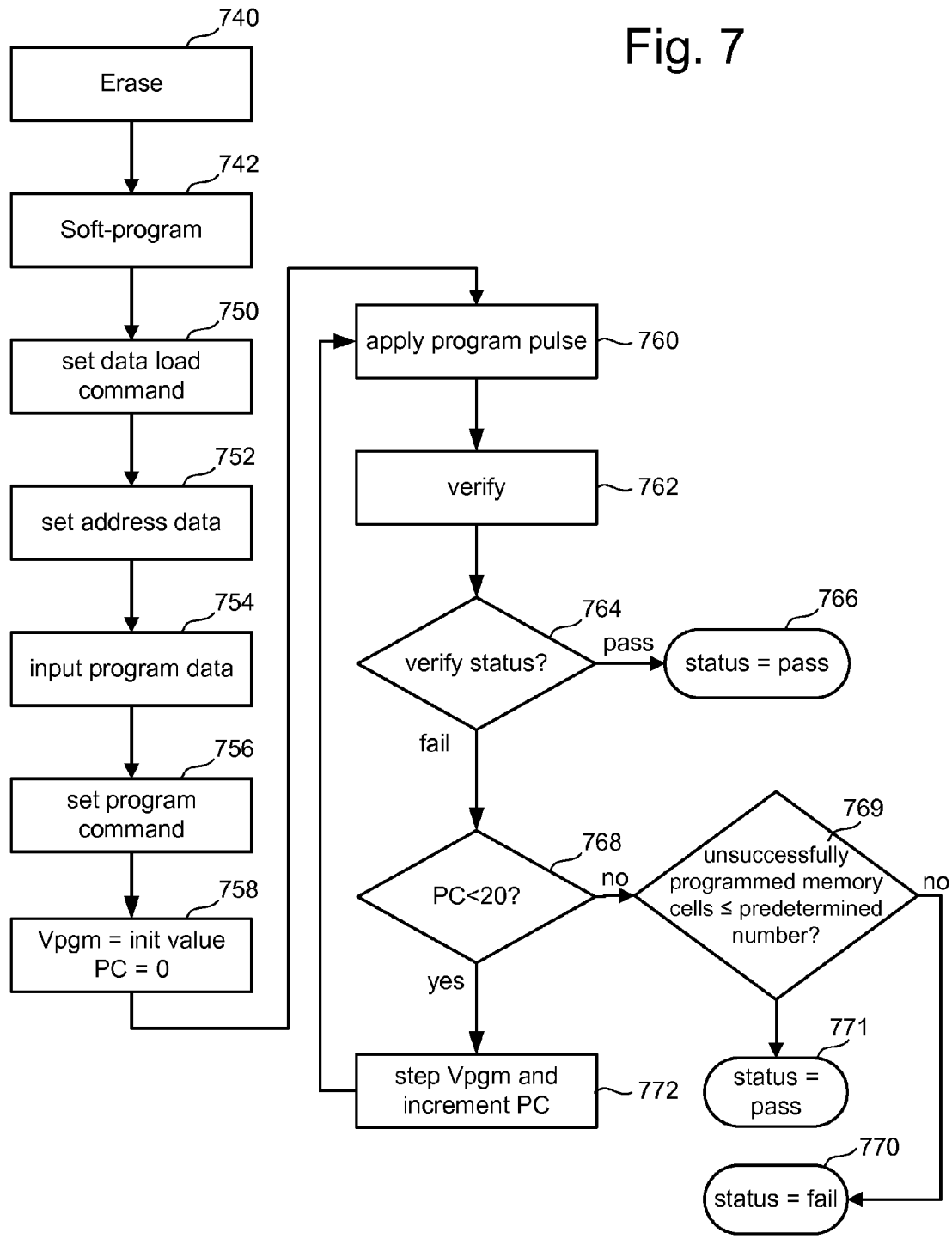

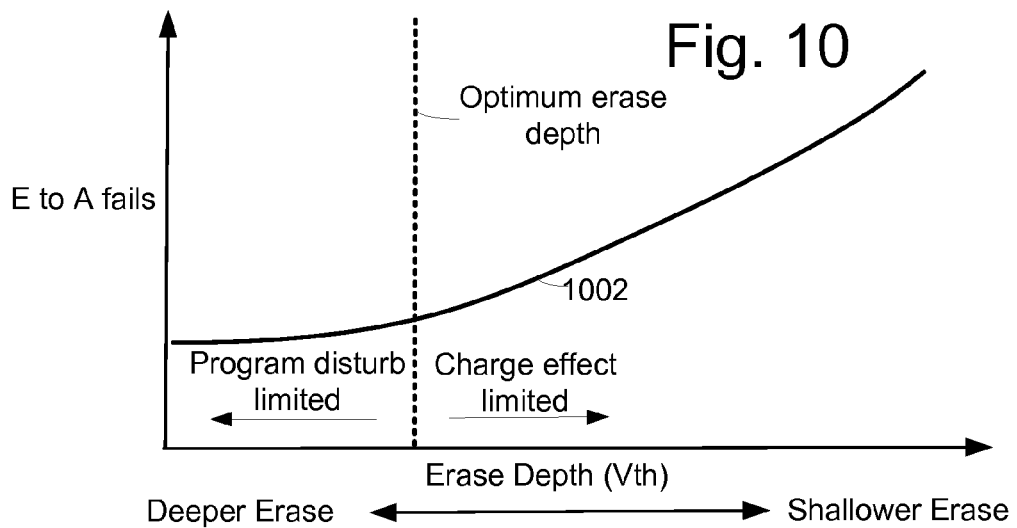
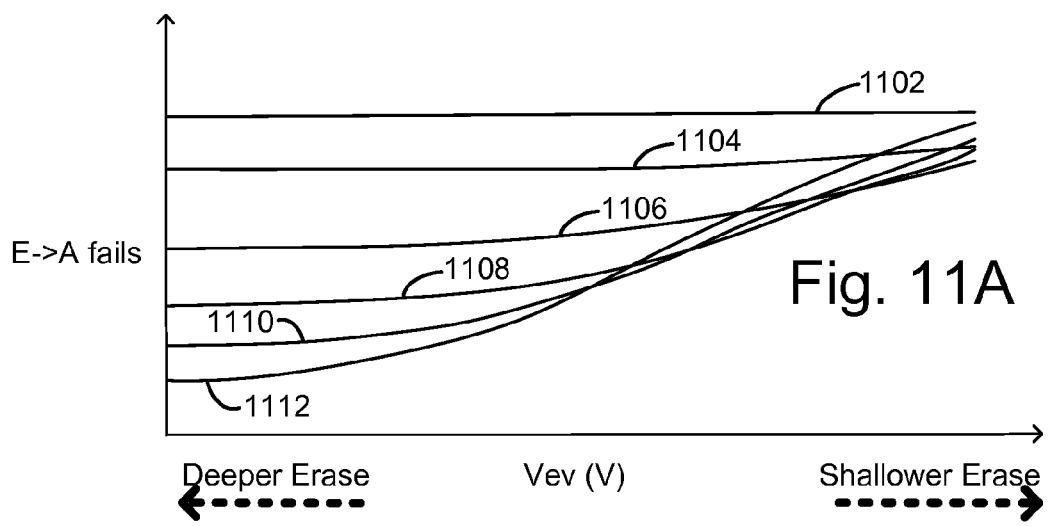
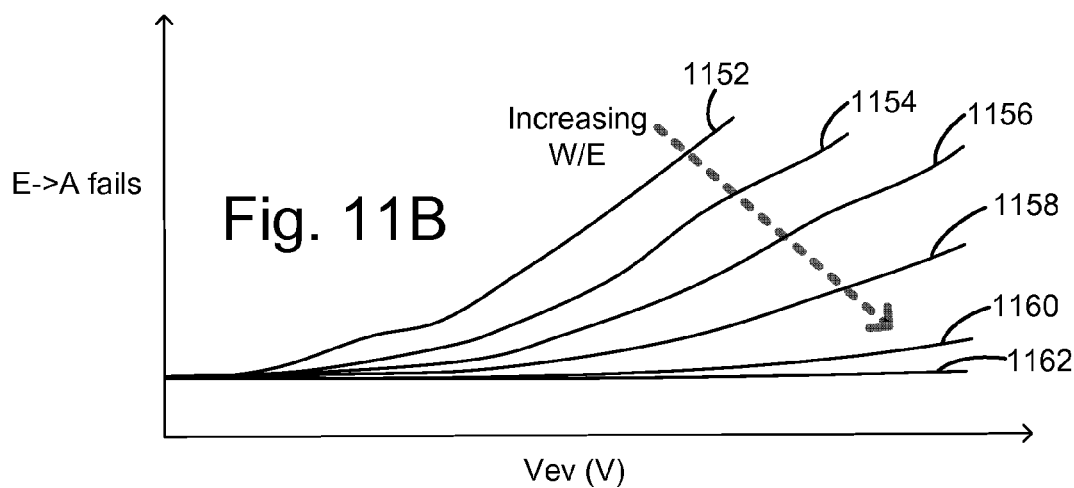

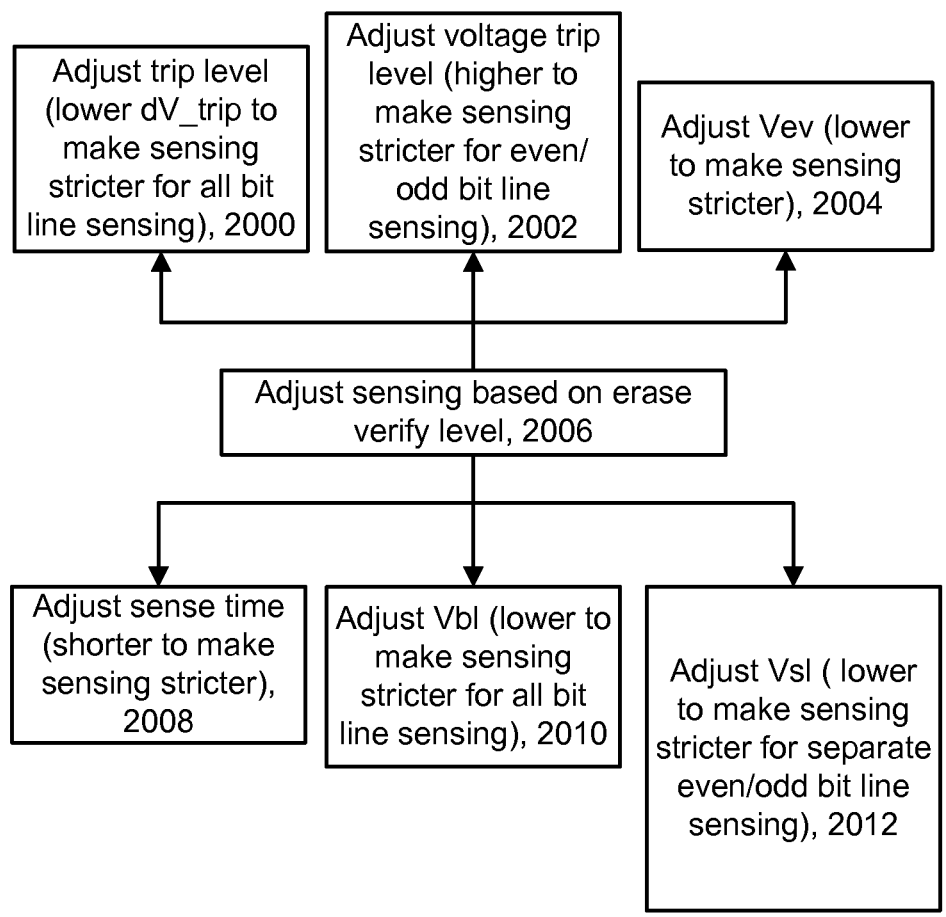

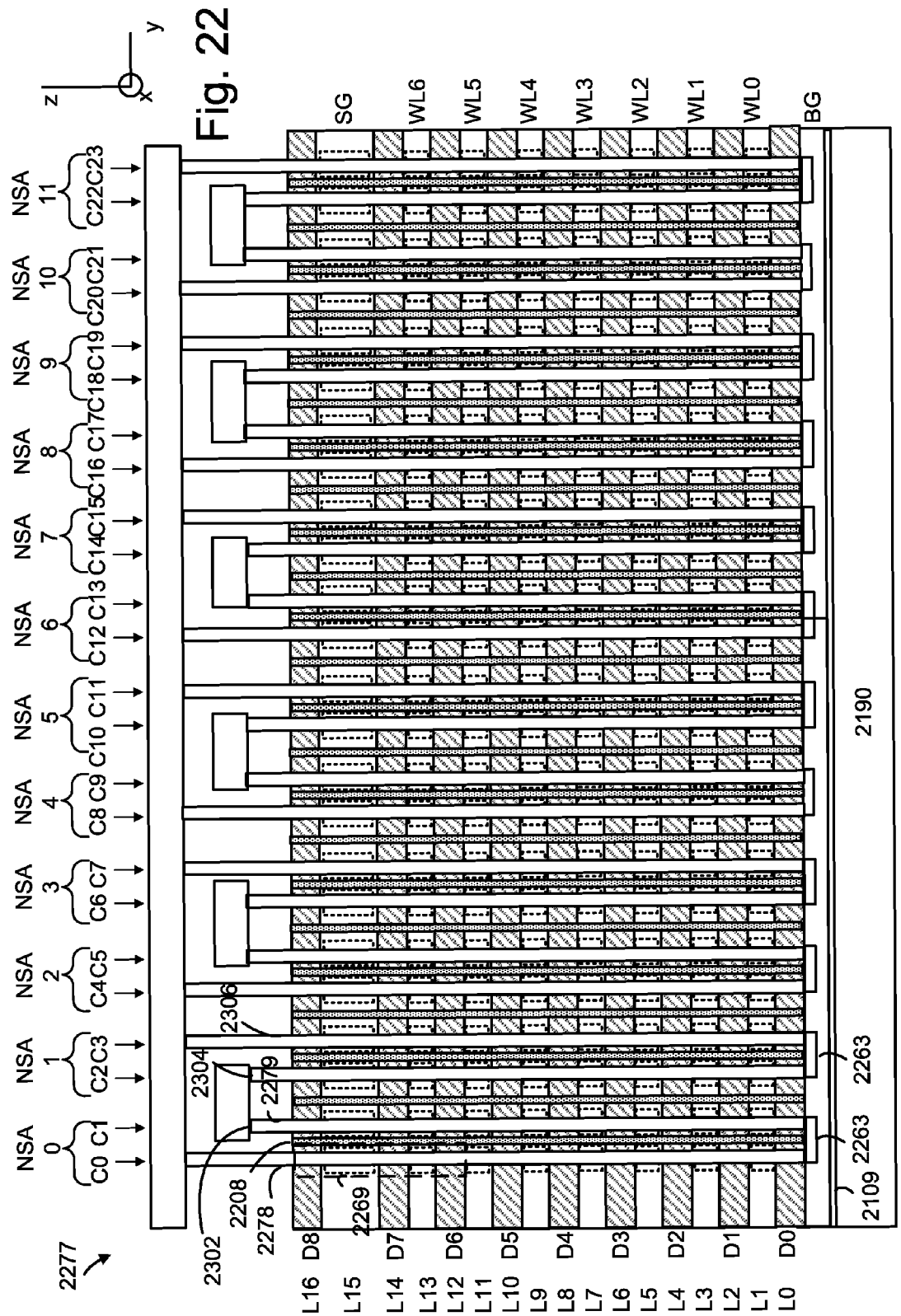

DYNAMIC ERASE DEPTH FOR IMPROVED ENDURANCE OF NON-VOLATILE MEMORY

PRIORITY

This application claims the benefit of U.S. Provisional Application No. 61/772,250, entitled, "PARTITIONED ERASE AND ERASE VERIFICATION IN NON-VOLATILE MEMORY," filed on Mar. 4, 2013, which is incorporated herein by reference.

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory utilizes a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A back gate may surround the pipe connection to control conduction of the pipe connection. Control gates of the memory cells are provided by the conductor layers.

Prior to programming certain non-volatile memory devices, such as a NAND flash memory device, the memory cells are typically erased. The erase operation removes electrons from the floating gate, for some devices. For other devices, the erase operation removes electrons from the charge trapping layer.

The memory cells typically degrade with increasing erase/program cycles (also referred to as write/erase or W/E cycles). The number of W/E cycles that a memory device can withstand and still operate within tolerance is one measure of endurance. As the memory cells scale down in size, endurance typically gets worse.

BRIEF DESCRIPTION OF THE DRAWINGS

FIG. 6 depicts a program voltage signal in accordance with one embodiment.

FIG. 7 is a flow chart describing one embodiment of a method for programming non-volatile memory.

FIG. 8A illustrates exemplary threshold voltage distributions for a memory cell array when each memory cell stores two bits of data in four physical states.

FIG. 10 is a graph that shows E to A fails versus erase verify levels.

FIG. 11A shows E to A fails versus erase depth for several different erase/program cycles.

FIG. 11B shows a normalized version of E to A fails versus erase depth for several different erase/program cycles.

FIG. 20 depicts an example process for adjusting sensing parameters based on a target verify level to make the sensing more or less strict.

FIG. 22 depicts a cross-sectional view of a block of a 3D non-volatile memory device in which embodiments of dynamic erase depth may be practiced.

DETAILED DESCRIPTION

Technology is described herein for improving endurance of a non-volatile memory device such as a NAND memory device. Memory cells may have one or more insulating or dielectric layers. These insulating or dielectric regions could include an oxide (e.g., silicon oxide), but are not so limited. Electrons (or other charge carriers) may enter or cross those insulating or dielectric regions during operation. For example, with 2D NAND, there may be a tunnel oxide between the floating gate and the channel. There also may be an inter-gate dielectric (IPD) between the floating gate and control gate. Sometimes the IPD is formed from oxide-nitride-oxide (ONO), although other dielectrics may be used. One possible reason for endurance degradation is charge trapping in, for example, the tunnel oxide and/or the IPD. This charge trapping typically builds up with additional erase/program cycles. Note that 3D NAND may also have oxide regions near the storage elements. Thus, during program and erase operations, electrons may enter or cross an oxide region in 3D NAND and lead to endurance issues.

Embodiments disclosed herein include dynamically adjust the depth of erase, which can improve endurance. In one embodiment, a group of memory cells are erased. Then, at least some of the erased memory cells are programmed. Programming the memory cells typically impacts the erase threshold distribution of those memory cells that were intended to stay erased. The erase depth (for future erase operations) can be adjusted based on how the program operation affects the erase threshold distribution. As one example, the upper tail of the erase distribution is measured after programming. The higher the upper tail, the shallower the next erase, in one embodiment. This helps to improve endurance. In one embodiment, the erase depth is dynamically adjusted by determining a suitable erase verify level. Rather than (or in addition to) adjusting the erase verify level, the number of erase pulses that are performed after erase verify passes can be adjusted to dynamically adjust the erase depth.

Figure 1A:
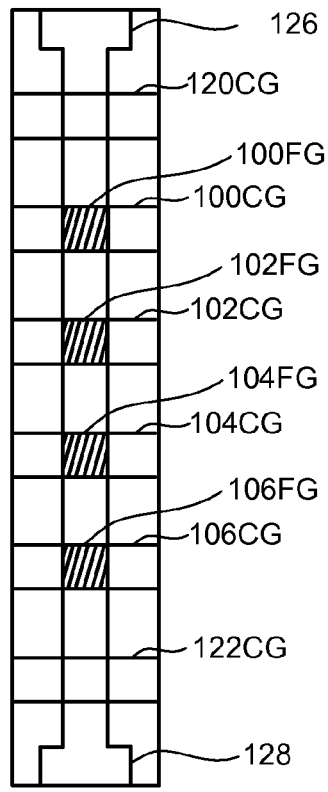
FIG. 1A is a top view of a NAND string.
Figure 1B:
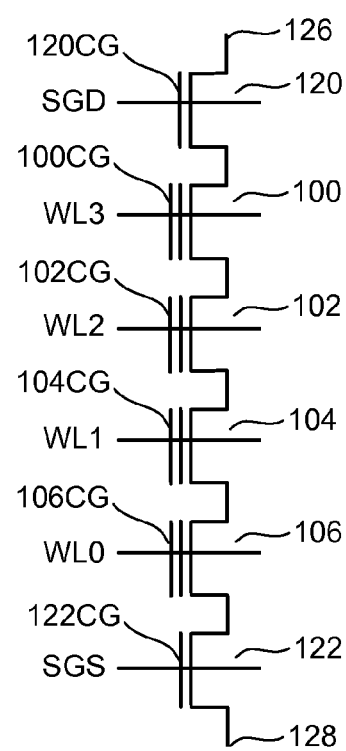
FIG. 1B is an equivalent circuit diagram of the NAND string of FIG. 1A.

Techniques disclosed herein may be applied to 2D NAND and 3D NAND, but are not necessarily limited thereto. A NAND flash memory structure may arrange multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
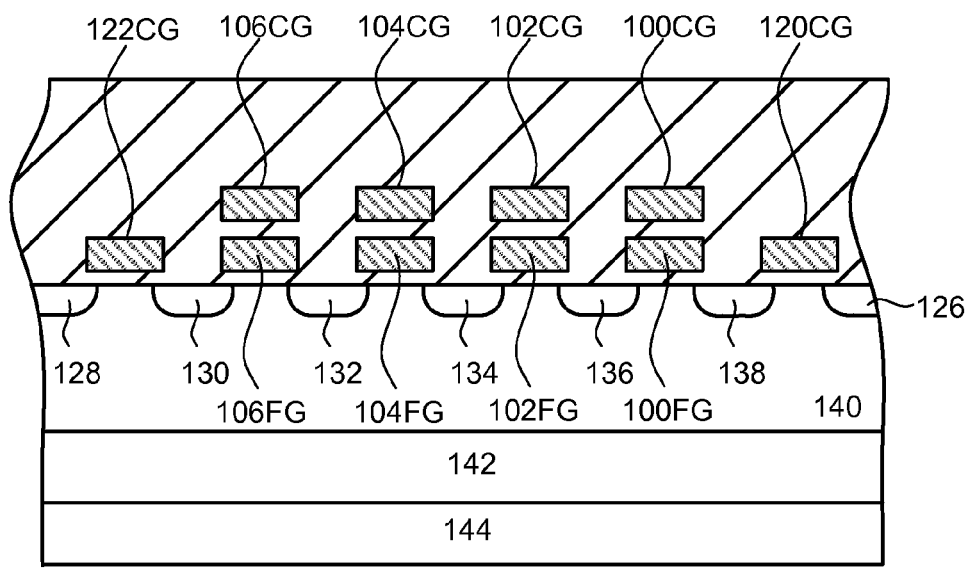
FIG. 2 is a cross-sectional view of the NAND string of FIG. 1A.

FIG. 2 provides a cross-sectional view of one embodiment of the NAND string described above. FIG. 2 is for a 2D NAND string formed in a substrate. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semiconductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
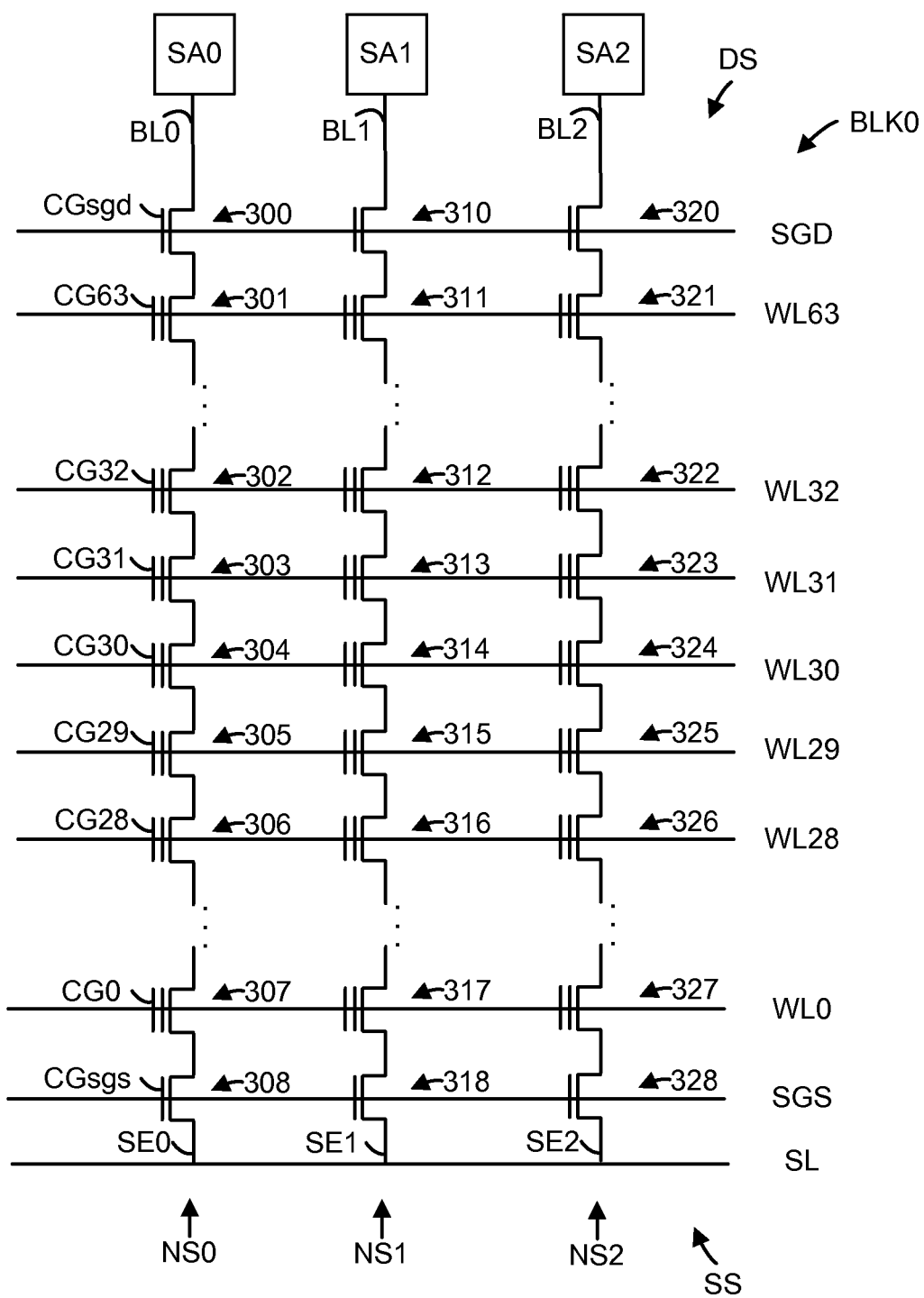
FIG. 3 depicts three example NAND strings such as shown in FIGS. 1A-2 in a block BLK0.

FIG. 3 depicts three example NAND strings such as shown in FIGS. 1A-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. Another example NAND string NS1 includes storage elements 311, . . . , 312-316, . . . , 317, an SGS transistor 318 and a SGD transistor 310. Another example NAND string NS2 includes storage elements 321, . . . , 322-326, . . . , 327, an SGS transistor 328 and a SGD transistor 320. The NAND strings NS0, NS2, . . . are even numbered, and the NAND strings NS1, NS3 (not shown), . . . are odd numbered. Similarly, the bit lines BL0, BL2, . . . are even numbered, and the NAND strings BL1, BL3 (not shown), . . . are odd numbered. The storage elements can store user data and/or non-user data.

Figure 4:
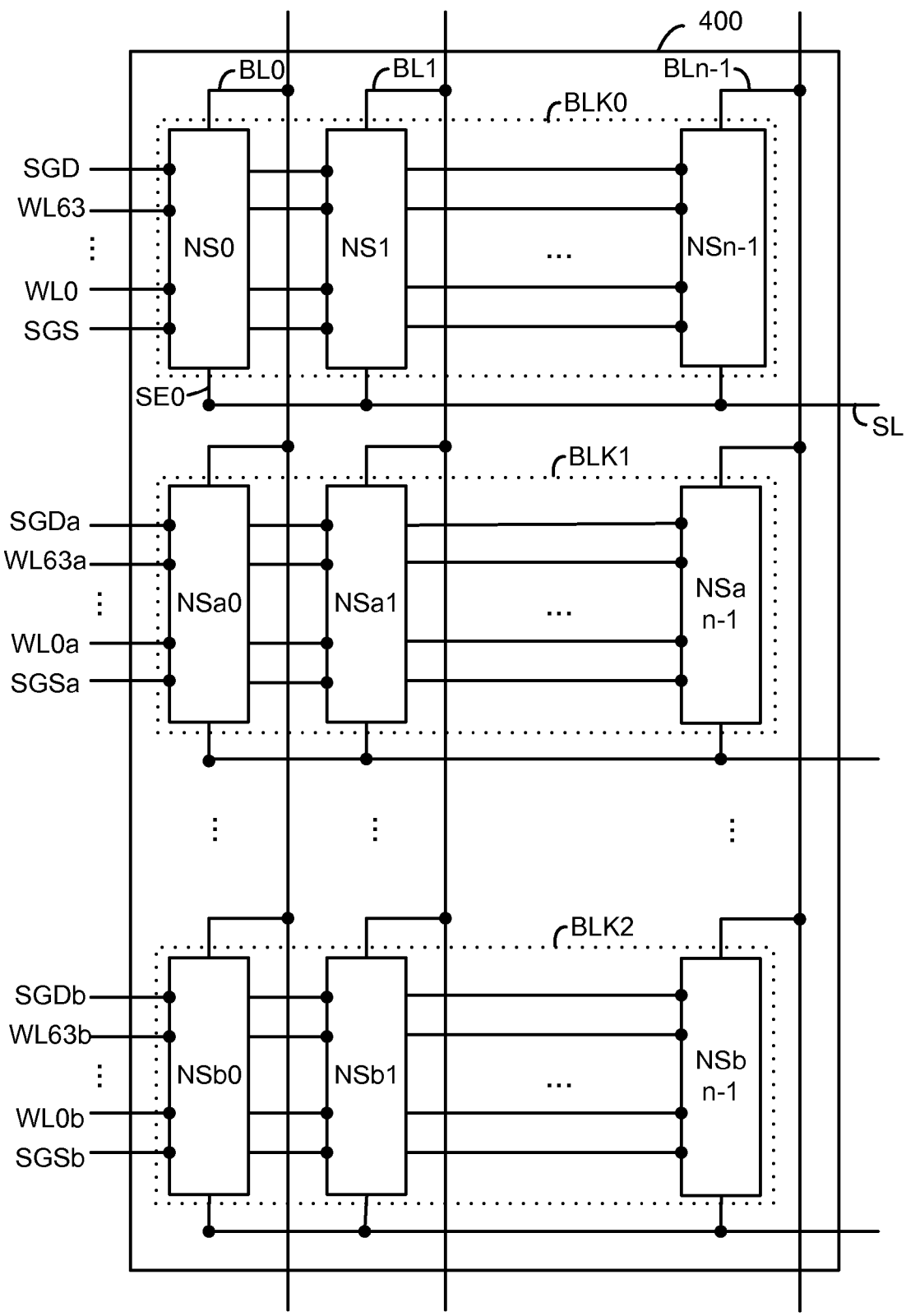
FIG. 4 is a block diagram of an array 400 of NAND flash memory cells including BLK0 of FIG. 3 and additional blocks BLK1 and BLK2.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn-1 in communication with BL0, BL1, . . . BLn-1, respectively, and with WL0-WL63 SGS and SGD. BLK1 includes NAND strings NSa0, NSa1, . . . , NSan-1 in communication with BL0, BL1, . . . BLn-1, respectively, and with WL0a-WL63a, SGSa and SGDa. BLK2 includes NAND strings NSb0, NSb1, . . . , NSbn-1 in communication with BL0, BL1, . . . BLn-1, respectively, and with WL0b-WL63b, SGSb and SGDb.

As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells. In one embodiment, 3D NAND is erased using a different technique. 3D NAND will be further discussed below.

Figure 5A:
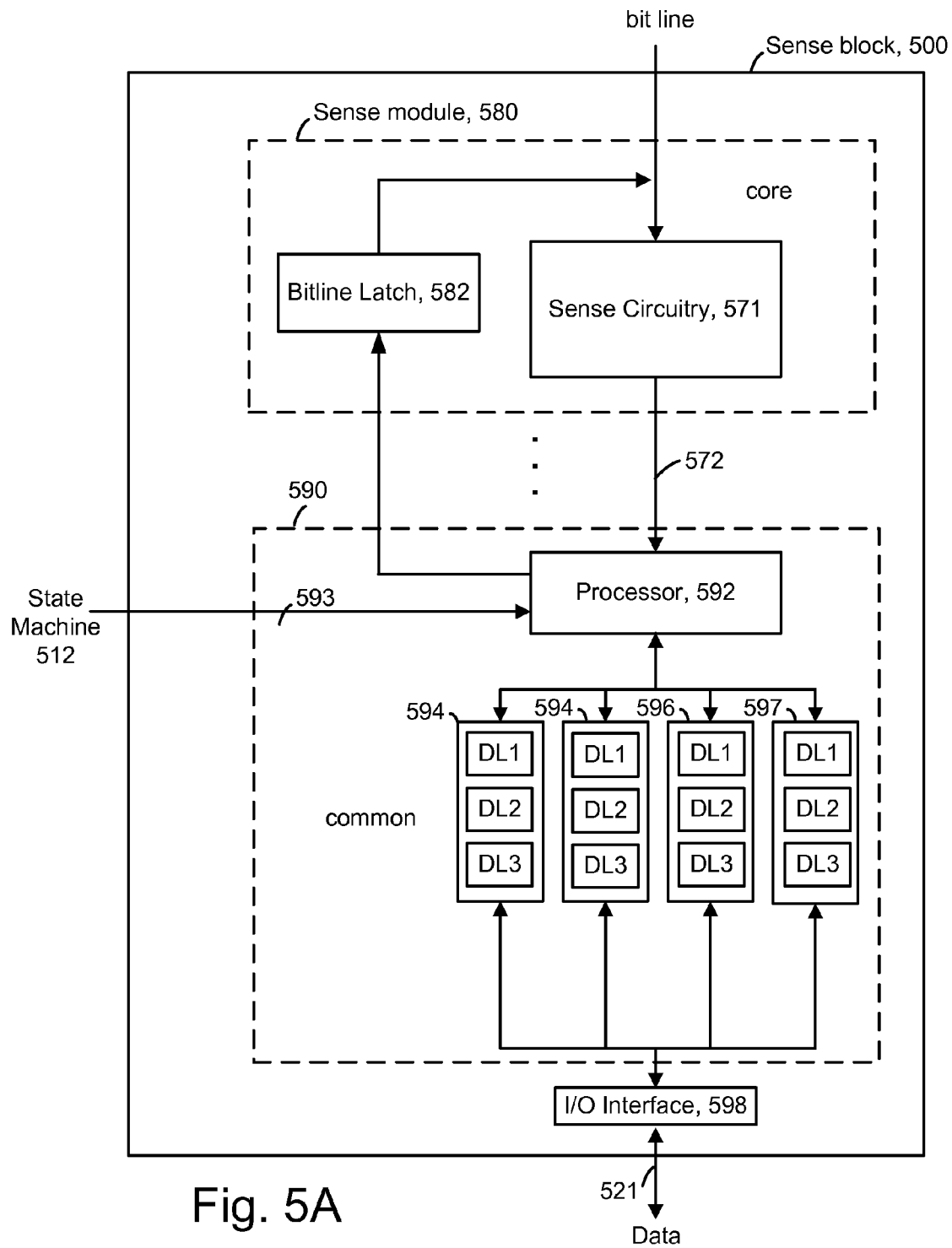
FIG. 5A is a block diagram depicting one embodiment of a sense block.

FIG. 5A is a block diagram depicting one embodiment of a sense block 500. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block 500 will include one common portion 590 and eight sense modules 580. Each of the sense modules in a group will communicate with the associated common portion via a data bus 572.

Sense module 580 comprises sense circuitry 571 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). As an example, a flag=0 can inhibit programming, while flag=1 does not inhibit programming.

Common portion 590 comprises a processor 592, three example sets of data latches 594 and an I/O Interface 598 coupled between the sets of data latches 594 and data bus 521. One set of data latches can be provided for each sense module, and three data latches identified by DL1, DL2, and DL3 may be provided for each set. The use of the data latches is further discussed below.

Processor 592 performs computations. For example, one of its functions is to determine the data stored in the sensed storage element and store the determined data in the set of data latches. At least some of the data latches in a set of data latches (e.g., 594) are used to store data bits determined by processor 592 during a read operation. At least some of the data latches in a set of data latches are also used to store data bits imported from the data bus 521 during a program operation. The imported data bits represent write data meant to be programmed into the memory. I/O interface 598 provides an interface between data latches 594-697 and the data bus 521.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches (e.g., 594). In another embodiment of the core portion, bit line latch 582 serves both as a latch for latching the output of the sense module 580 and as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594-597 from the data bus 521. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Each set of data latch stacks 594-597 contains a stack of data latches corresponding to the sense module 580, in one embodiment. In one embodiment, there are three data latches per sense module 580. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5A) for initially storing the third bit of data that is to be programmed into a storage element. In one embodiment, the storage elements four bits per storage element, in which there may be two additional data latches (not depicted in FIG. 5A) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory and Method with Reduced Source Line Bias Errors,"; (2) U.S. Pat. No. 7,023,736, "Non-Volatile Memory and Method with Improved Sensing,"; (3) U.S. Pat. No. 7,046,568, "Memory Sensing Circuit and Method for Low Voltage Operation"; (4) U.S. Pat. No. 7,196,928, "Compensating for Coupling during Read Operations of Non-Volatile Memory," and (5) U.S. Pat. No. 7,327,619, "Reference Sense Amplifier for Non-Volatile Memory". All five of the immediately above-listed patent documents are incorporated herein by reference in their entirety.

Figure 5B:
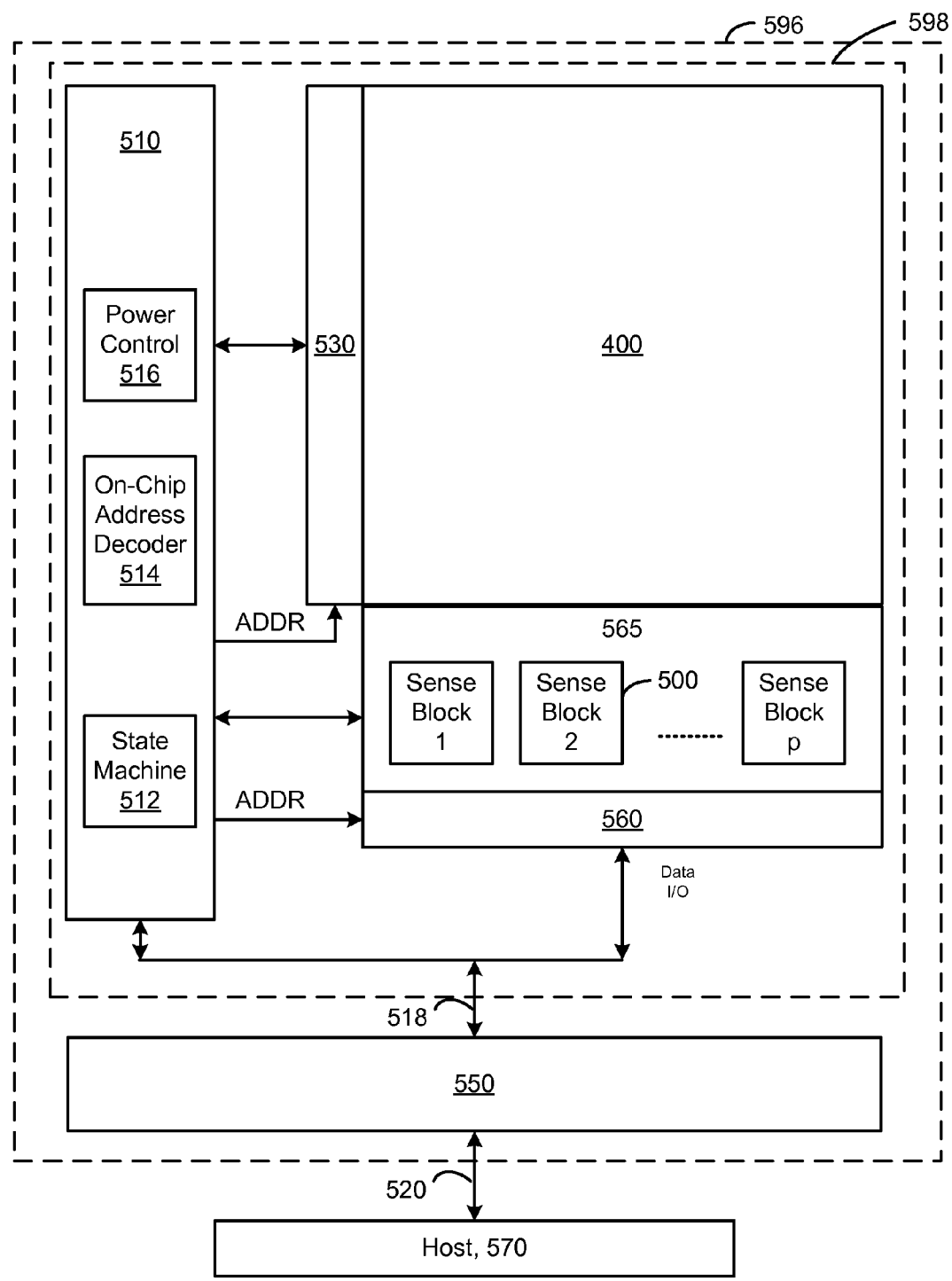
FIG. 5B is a block diagram of a non-volatile memory system which includes the array 400 of FIG. 4.

FIG. 5B is a block diagram of a non-volatile memory system which includes the array 400 of FIG. 4. The memory array 400 could include a 2D architecture or a 3D architecture. One example of a 3D architecture is a BiCS architecture. A 3D architecture may include 3D vertical NAND strings. The memory cells in 3D vertical NAND strings may include an ONO layer to store information. The information may be stored in a charge trapping layer such as, but not limited to, SiN. Note that an ONO layer can be used to store information for both 2D and 2D NAND, as well as other architectures. Thus, a floating gate may be used to store information, but is not required.

The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In another approach, dual row/column decoders and read/write circuits are used. A control circuit can be considered to comprise one or more of the components 510, 512, 514, 516, 530, 550, 560, 565, for instance.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 660 and 662 are three sequential verify pulses. The first verify pulse 664 is depicted at a zero volt verify voltage level. The second verify pulse 666 follows the first verify pulse at the second verify voltage level. The third verify pulse 668 follows the second verify pulse 666 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells.

FIG. 7 is a flow chart describing one embodiment of a method for programming non-volatile memory. The memory cells to be programmed are erased at step 740. Step 740 can include erasing more memory cells than those to be programmed (e.g., in blocks or other units). At step 742, soft-programming is performed to narrow the distribution of erased threshold voltages for the erased memory cells. Some memory cells may be in a deeper erased state than necessary as a result of the erase process. Soft-programming can apply small programming pulses to move the threshold voltage of the erased memory cells closer to the erase verify level. At step 750 of FIG. 7, a "data load" command is issued by controller 550 and input to command circuits, allowing data to be input to data input/output buffer. At step 752, address data designating the page address is input to row controller or decoder 514 from the controller or host. The input data is recognized as the page address and latched via state machine 512, affected by the address latch signal input to command circuits. At step 754, a page of program data for the addressed page is input to data input/output buffer for programming. For example, 512 bytes of data could be input in one embodiment. That data is latched in the appropriate registers for the selected bit lines. In some embodiments, the data is also latched in a second register for the selected bit lines to be used for verify operations. At step 756, a "program" command is issued by the controller and input to data input/output buffer. The command is latched by state machine 512 via the command latch signal input to command circuits.

Triggered by the "program" command, the data latched in step 754 will be programmed into the selected memory cells controlled by state machine 512 using the stepped pulses of FIG. 6 applied to the appropriate word line. At step 758, Vpgm, the programming pulse voltage level applied to the selected word line, is initialized to the starting pulse (e.g., 12V) and a program counter PC maintained by state machine 512 is initialized at 0. At step 760, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to VDD to inhibit programming.

At step 762, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 764, it is checked whether all of the data latches are storing logic "1." If so, the programming process is complete and successful because all selected memory cells were programmed and verified to their target states. A status of "PASS" is reported at step 766.

If, at step 764, it is determined that not all of the data latches are storing logic "1," then the programming process continues. At step 768, the program counter PC is checked against a program limit value. One example of a program limit value is 20, however, other values can be used in various implementations. If the program counter PC is not less than 20, then it is determined at step 769 whether the number of bits that have not been successfully programmed is equal to or less than a predetermined number. If the number of unsuccessfully programmed bits is equal to or less than the predetermined number, then the programming process is flagged as passed and a status of pass is reported at step 771. The bits that are not successfully programmed can be corrected using error correction during the read process. If however, the number of unsuccessfully programmed bits is greater than the predetermined number, the program process is flagged as failed and a status of fail is reported at step 770. If the program counter PC is less than 20, then the Vpgm level is increased by the step size and the program counter PC is incremented at step 772. After step 772, the process loops back to step 760 to apply the next Vpgm pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 758-772 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

At the end of a successful program process, the threshold voltages of the memory cells should be within one or more distributions of threshold voltages for programmed memory cells or within a distribution of threshold voltages for erased memory cells. FIG. 8A illustrates exemplary threshold voltage distributions for a memory cell array when each memory cell stores two bits of data in four physical states. Distribution 800 represents a distribution of threshold voltages of cells that are in an erased state (storing "11"), which may have negative threshold voltage levels. Distribution 802 represents a distribution of threshold voltages of cells that are in a first programmed state ("A"), storing "10." Distribution 804 represents a distribution of threshold voltages of cells that are in a second programmed state (B), storing "00." Distribution 806 represents a distribution of threshold voltages of cells that are in a third programmed state ("C"), storing "01."

When programming the memory cells, they may be verified using verify reference levels Vva, Vvb, and Vvc, for the A-C states respectively. When reading the memory cells, the read reference level Vra may be used to determine whether memory cells at the A-state distribution or higher. Likewise, Vrb and Vrc are read reference levels for the B- and C-states, respectively.

Note that when memory cells are initially erased, they may be erased using an erase verify level Vev, resulting in an initial erase distribution 801. The later programming of the other states may cause the upper tail of the erase distribution to shift to the right. It is possible for some of the final erase distribution 800 to be above (higher Vth) than the A-state read level.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Memory cells are erased in one embodiment by raising the p-well to an erase voltage (e.g. 20 volts) and grounding or applying 0 volts to the word lines of a selected block while the source and bit lines are floating. Due to capacitive coupling, the unselected word lines (e.g., those in unselected, not to-be-erased blocks), bit lines, select lines, and common source lines are also raised to a high positive potential (e.g., 20V). A strong electric field is thus applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its charge storage region (e.g., floating gate or charge trapping layer). For devices have a floating gate, as sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. Thus, erasing a memory cell refers to lowering the threshold voltage of a memory cell and does not imply complete or successful erasing thereof. Erasing can be performed on the entire memory array, one or more blocks of the array, or another unit of cells. The erase voltage signal $V_{sense}$ is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

Figure 8B:
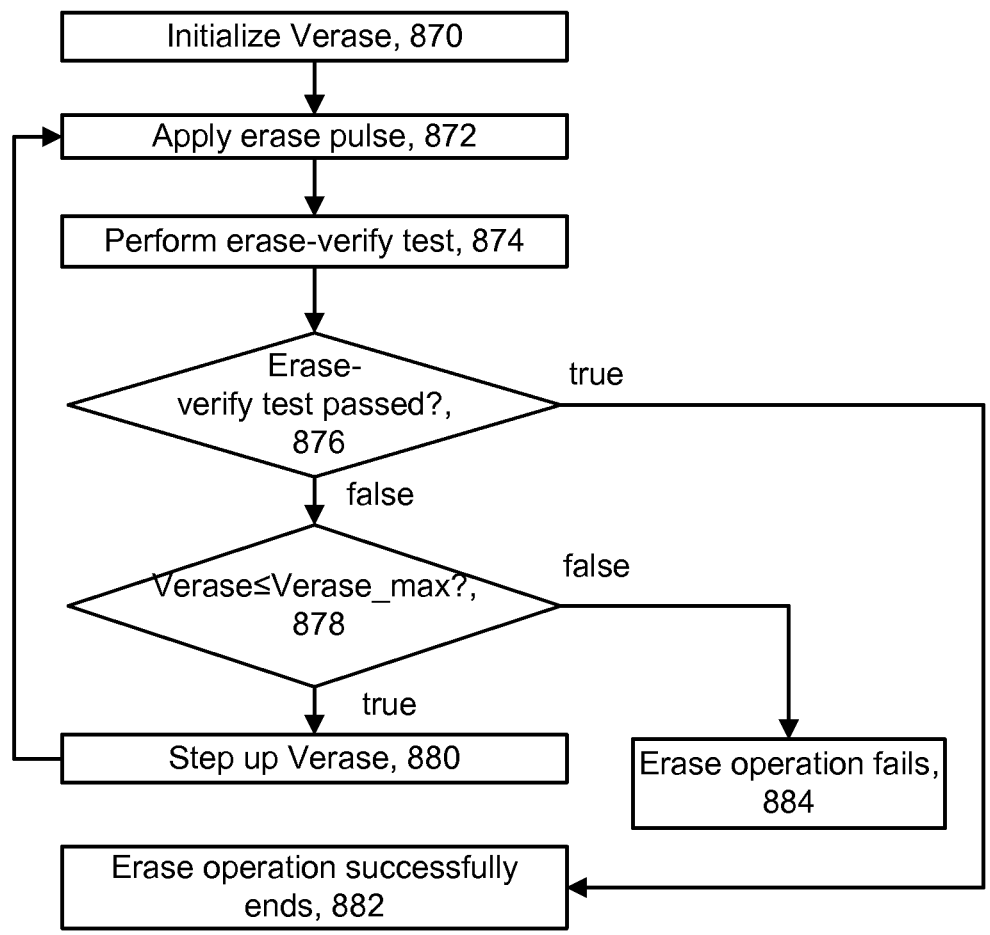
FIG. 8B depicts an example erase operation.

FIG. 8B depicts an example erase operation. The steps include: Initialize Verase, 870; Apply erase pulse, 872; Perform erase-verify test, 874; Erase-verify test passed?, 876; Verase≤Verase_max?, 878; Step up Verase, 880; Erase operation successfully ends, 882; and Erase operation fails, 884. In one approach, Verase is the level of a voltage which is applied to the substrate of a block to draw electrons out of the floating gate of a storage element to thereby lower the Vth of the storage element. Performing the erase-verify test can include concurrently applying a voltage Vev to multiple word lines in a block. The erase-verify test can be performed concurrently for storage elements associated with all bit lines (such as in FIG. 16A), even-numbered bit lines (such as in FIG. 16B) or odd-numbered bit lines (such as in FIG. 16C).

At decision step 876, the erase-verify test is passed if the sensed storage elements have reached the erased state (e.g., their Vth is below Vev so that the sensed storage elements and their respective NAND strings are in a conductive state).

If decision step 876 is true, the erase operation successfully ends (step 882). If decision step 876 is false, Verase is stepped up (see FIG. 9A) and an additional erase pulse is applied, if Verase has not yet reached a maximum level, Verase_max. If decision step 876 is false and Verase has exceeded the maximum level (e.g., decision step 878 is false), the erase operation fails at step 884.

In 2D NAND memory devices, the p-well substrate is biased at a high voltage to erase the storage elements, in one embodiment. Note that the NAND strings are typically formed in the substrate, such that by applying the erase voltage to the substrate while, for example, grounding the control gates, the memory cells can be erased. In contrast, the NAND strings in a 3D stacked non-volatile memory device such as BiCS are typically not formed in a substrate.

One approach to erasing in a 3D stacked non-volatile memory device is to generate gate induced drain leakage (GIDL) current to charge up the channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Figure 8C:
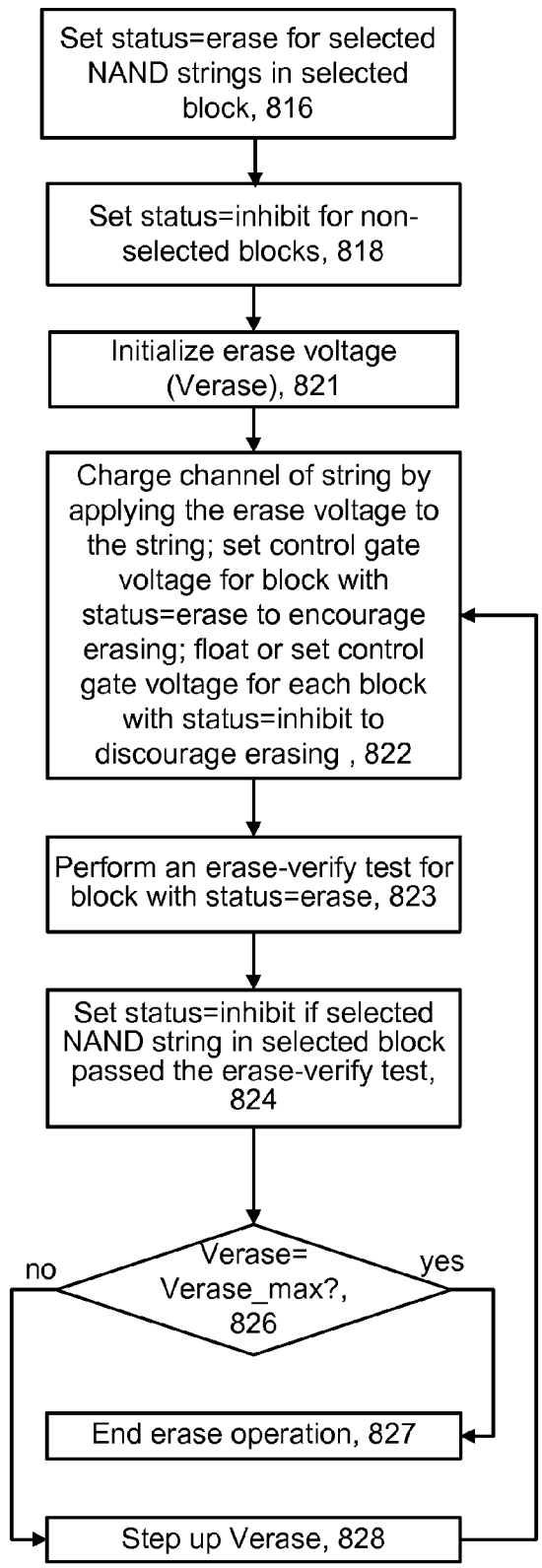
FIG. 8C is a flowchart of one embodiment of a process of performing an erase operation in 3D NAND.

FIG. 8C is a flowchart of one embodiment of a process of performing an erase operation in 3D NAND. Generally, an erase operation can include multiple erase-verify iterations which are performed until a verify condition is met, at which point the erase operation ends. Optionally, one or more additional erase voltages can be applied after verify has been passed. In one approach, the memory device includes NAND strings which have a drain-side select gate (SGD) transistor on one end and a source-side select gate (SGS) transistor on the other end (see FIG. 22). The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Step 816 sets status=erase for the storage elements on the selected NAND string that are in the selected block.

Step 818 sets status=inhibit for the storage elements in the unselected blocks.

Step 821 initializes an erase voltage (Verase) to a starting value.

Step 822 charges the channel of the 3D NAND string by applying the erase voltage to the string, setting a control gate voltage for each storage element with status=erase to encourage erasing, and floating or setting a control gate voltage for each storage element with status=inhibit to discourage erasing. For example, a control gate voltage at a relatively high level (e.g., 10-15 V) discourages erasing by creating a small potential difference across the tunneling layer.

A control gate voltage at or slightly above, for example, 0 V encourages erasing by creating a large potential difference across the tunneling layer, between the channel and the control gate, which encourages further tunneling.

Step 823 performs an erase-verify test for storage elements in the selected block (for the selected NAND string). The erase-verify test can be performed concurrently for the different storage elements on the string. For example, this can involve applying a common erase-verify control gate voltage (Vv_erase) to the control gate of each storage element in the selected block while detecting the current through the string.

If the current of the string is above a reference current, indicating the string is conductive, the erase-verify test is passed.

Step 824 sets status=inhibit if the selected NAND string passed the erase-verify test. The erase status=erase is continued if the selected NAND string does not pass the erase-verify test.

Decision step 826 determines if Verase is at Verase max. If the answer is "yes," the erase operation ends unsuccessfully at step 827. If the answer is "no," Verase is stepped up at step 828 and another iteration is performed at step 822.

Figure 9A:
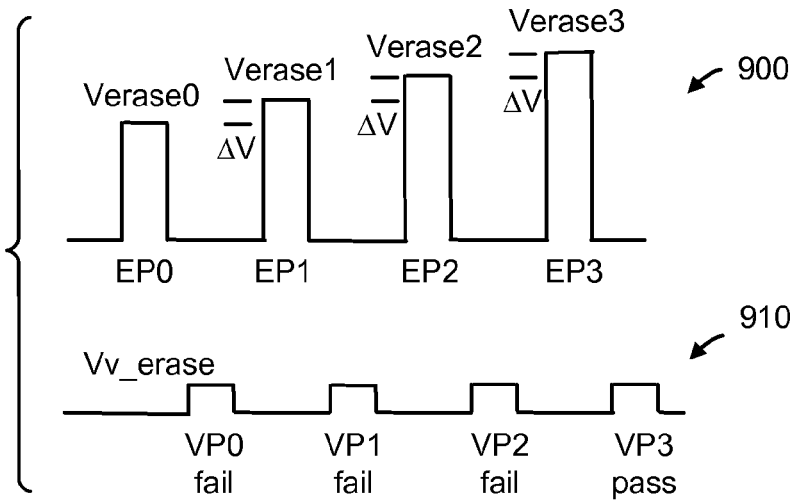
FIG. 9A depicts an example erase operation in which each erase pulse is followed by a verify pulse.

FIG. 9A depicts an example erase operation in which each erase pulse is followed by a verify pulse. In one embodiment, the magnitude of the verify pulse is adjusted to dynamically erase at a different depth. An erase operation can be performed for a block of storage elements by applying one or more erase pulses, e.g., EP0-EP3 (waveform 900) to a substrate on which the block is formed. After the first erase pulse EP0, the peak amplitude of each erase pulse can be stepped up from the previous erase pulse by a step size ΔV. In one approach, after each erase pulse is applied to the substrate, a verify operation is performed as represented by waveform 910. Waveform 910 shows verify pulses or voltages VP0-VP3 of amplitude Vev which are applied to one or more word lines of storage elements being erased. VP0-VP3 are verify pulses associated with, and following, EP0-EP3, respectively. In this example, it is assumed that the erase operation ends successfully after VP3. Thus, the erase-verify test associated with VP0-VP2 is failed, and the erase-verify test associated with VP3 is passed.

Figure 9B:
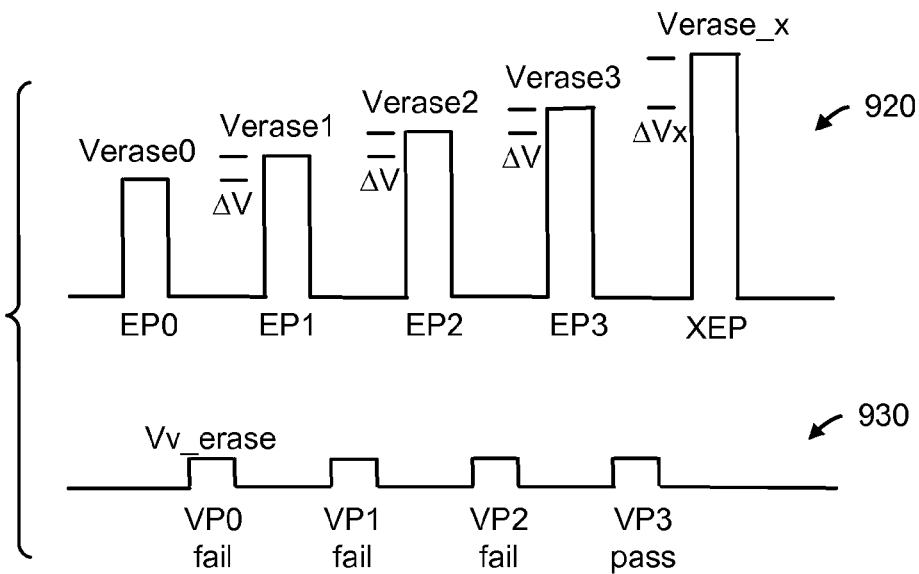
FIG. 9B depicts an example erase operation in which a last, extra erase pulse is not followed by a verify pulse.

FIG. 9B depicts an example erase operation in which an extra erase pulse (XEP) is not followed by a verify pulse. In one embodiment, the number of "extra pulses" that follow the last verify is adjusted to dynamically erase at a different depth. The erase operation may be performed for a block of storage elements by applying erase pulses EP0-EP3 and XEP (waveform 920) to a substrate on which the block is formed. For EP1-EP3, the peak amplitude of each erase pulse can be stepped up from the previous erase pulse by a step size ΔV (ΔVerase). In this example, it is assumed that the erase-verify test associated with VP0-VP2 is failed, and the erase-verify test associated with VP3 is passed. Instead of ending the erase operation at this point, as in FIG. 9A, one or more extra or additional erase pulses (XEP) are applied to the substrate, where the one or more extra or additional erase pulses are not followed by an associated verify pulse. The peak amplitude of the one or more extra erase pulse XEP can be stepped up from the previous erase pulse EP3 by a step size ΔVx which is the same or different than ΔV. In one approach, ΔVx>ΔV. Waveform 930 shows verify pulses or voltages VP0-VP3 of amplitude Vev which are applied to one or more word lines of storage elements being erased. VP0-VP3 are verify pulses associated with, and following, EP0-EP3, respectively. This approach has an advantage that the storage elements are erased to a sufficient depth, without changing the erase-verify test.

Note that the processes of FIGS. 9A and 9B may be modified for use in 3D NAND. As noted above, a difference is that 3D NAND may create GIDL to erase, instead of applying a pulse to the substrate.

Dynamic Erase Depth

Technology is described herein for improving endurance of a non-volatile memory device such as a NAND memory device. The memory device could include a 2D architecture or a 3D architecture. One example of a 3D architecture is a BiCS architecture. A 3D architecture may include 3D vertical NAND strings. The memory cells in 3D vertical NAND strings may include an ONO layer to store information. The information may be stored in a charge trapping layer such as, but not limited to, SiN. Note that an ONO layer can be used to store information for both 2D and 2D NAND, as well as other architectures. Thus, a floating gate may be used to store information, but is not required.

Memory cells may have one or more insulating or dielectric layers. These regions could include an oxide (e.g., silicon oxide), but are not so limited. Also electrons may enter or cross those regions during operation. For example, with 2D NAND, there may be a tunnel oxide between the floating gate and the channel. There also may be an inter-gate dielectric (IPD) between the floating gate and control gate. Sometimes the IPD is formed from oxide-nitride-oxide (ONO), although other dielectrics may be used. One possible reason for endurance degradation is charge trapping in, for example, the tunnel oxide and/or the IPD. This charge trapping typically builds up with additional erase/program cycles. Note that 3D NAND may also have oxide regions near the storage elements. Thus, during program and erase operations, electrons may enter or cross an oxide region in 3D NAND.

For some memory devices, a greater swing between the threshold voltage of the erased state to the highest programmed state results in worse endurance. Therefore, from an endurance point of view, a shallower (higher $V_{TH}$) erase, results in better endurance, for at least some devices.

However, erasing shallower may cause more Erased state cells that are erased insufficiently, which typically manifests as E to A fails (or E to X fails in general where X can be A or B or C). FIG. 10 is a graph that shows E to A fails versus erase verify levels. An E to A failure refers to a memory cell that was intended to stay erased but whose $V_{TH}$ is above an A read reference level (e.g., Vra in FIG. 8A) after programming the other memory cells. A higher erase verify level corresponds to a shallower erase. Curve 1002 shows that a shallower erase leads to greater E to A failures. The reasons for more E to A fails for a shallower erase may be due to the cell-interference effects that increases the apparent $V_{TH}$ of the erased state. For some devices, cell interference effects are sometimes referred to as floating gate to floating gate coupling effects.

For purposes of discussion, the E to A failures in the region to the right of the line labeled "optimum erase depth" are referred to as being limited by charge effects, which may also be referred to as "cell-interference effects".

Once the erase is sufficiently deep enough, the E to A fails may be fairly independent of the erase-depth. In this regime, the E to A fails may be limited by program disturb, which is independent of the initial state of the erased state. For purposes of discussion, the E to A failures in the region to the left of the line labeled "optimum erase depth" are referred to as being limited by program disturb.

In view of the foregoing, the optimum erase depth may be viewed as the depth that reduces E to A fails to a minimum level, or at least close to the minimum level. That is, if the erase were made deeper than the optimum erase depth the number of E to A fails would not drop (or at least would not drop significantly). Of course, it is not required that erasing in accordance with embodiments herein be at an erase depth that achieves the lowest possible E to A fails.

The foregoing indicates one possible explanation for why there may be an optimum erase verify level (or erase depth), which may be roughly between the two regions just mentioned. However, there may be other explanations for an optimum erase depth.

However, as the memory device is cycled (e.g., W/E cycles), the ideal erase depth may shift to higher levels. One possible reason for this shift is that program disturb increases with cycling. A possible cause of the program disturb increase may be a decrease in the effectiveness of boosting potential. Boosting potential refers to voltages applied to un-selected word lines during programming to increase the channel potential of un-selected NAND strings. This increase in program disturb may shift the program disturb regime to higher erase verify levels.

A second possible reason for the shift in ideal erase depth is that Icell may drop with increasing cycling, which may make it more difficult for erase verify to pass. Here, "Icell" refers to the current conducted by a memory cell in response to a reference voltage applied to the control gate. By Icell dropping, it is meant that the same reference voltage results in a lower memory cell current. The drop in Icell with cycling means that using the same erase verify settings will results in the erase depth actually getting deeper with more cycles. This, in turn, may make the ideal erase verify setting shift to higher Vt levels as the device is cycled.

The foregoing is summarized in FIGS. 11A and 11B. FIG. 11A shows E to A fails versus erase depth for several different W/E cycles. Curve 1112 is for the lowest number of W/E cycles. Curve 1102 is for the highest number of W/E cycles. The point at which each curve flattens out corresponds to the point at which E to A fails are minimized (or close thereto). The curves 1102-1112 show that a shallower erase will suffice as this example device is cycle more.

FIG. 11B shows a normalized version of the curves from FIG. 11B. Thus, this is a normalized version of E to A fails versus erase depth for several different erase/program cycles. Curve 1152 is for the lowest number of W/E cycles. Curve 1162 is for the highest number of W/E cycles. The arrow shows the direction of increasing W/E cycles. These curves 1152-1162 also show that a shallower erase will suffice as this example device is cycled more to reach the point at which E to A fails flatten out. In other words, a more shallow erase can be used with increasing W/E cycles without significantly affecting E to A fails.

Figure 12A:
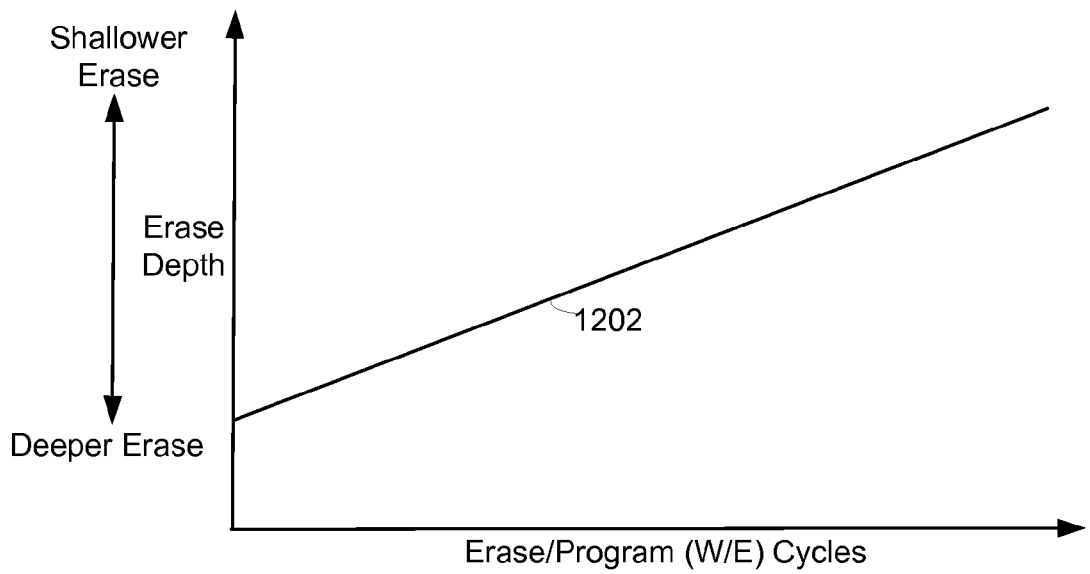
FIG. 12A is a graph of one possibility of optimum erase depth versus W/E cycles.

FIG. 12A is a graph of one possibility of optimum erase depth versus W/E cycles. Curve 1202 represents one possible optimum erase depth. That is, the curve 1202 represents an erase depth that is expected to result in minimizing (or at least reducing to close to minimum) the E to A fails. The y-axis is the erase depth, or the erase verify level. Curve 1202 shows that as the number or W/E cycles increases that erase should be more shallow.

Figure 12B:
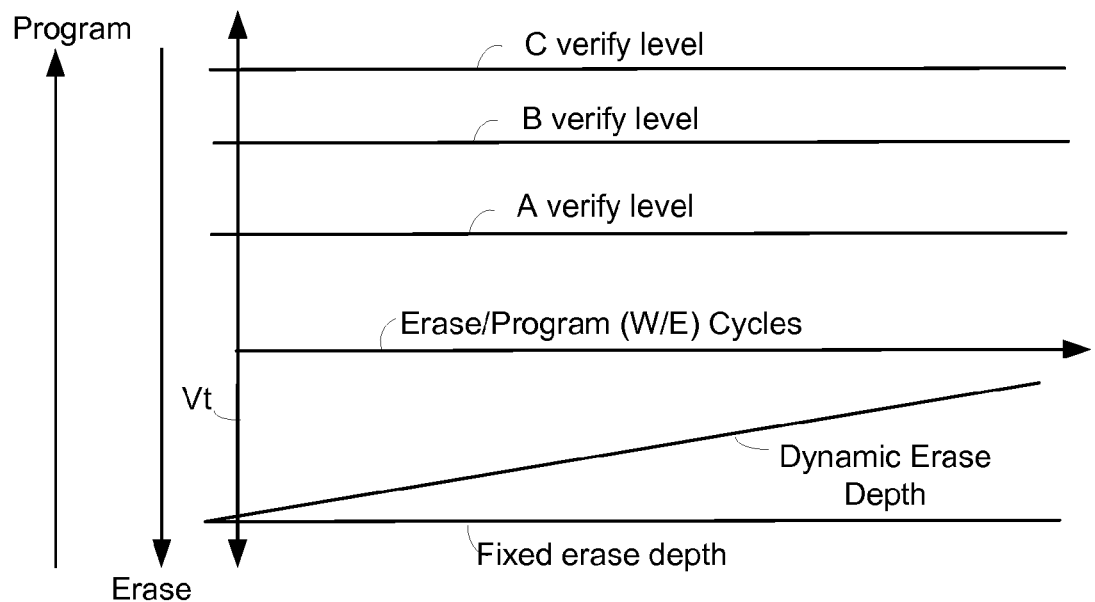
FIG. 12B is a graph that represents dynamic erase levels, in accordance with embodiments.

FIG. 12B is a graph that represents dynamic erase depth, in accordance with embodiments. The x-axis represents erase/program (W/E) cycles. The y-axis represents memory cell $V_{TH}$. When memory cells are programmed, their $V_{TH}$ are increased in this example. The A-verify level, B-verify level, and the C-verify level refer to several possible verify levels for programmed states. When memory cells are erased, their $V_{TH}$ are decreased in this example. The fixed erase depth refers to a conventional erase process in which the erase depth does not change with increasing W/E cycles.

The dynamic erase depth refers to an erase process in which the erase depth changes, in accordance with embodiments. As depicted the dynamic erase depth may decrease with increasing W/E cycles. However, simply tracking the number of W/E cycles may not provide an accurate enough measure of how deep the erase should be. Embodiments of dynamic erase depth perform some measurement that better indicates how deep the erase should be.

Figure 13A:
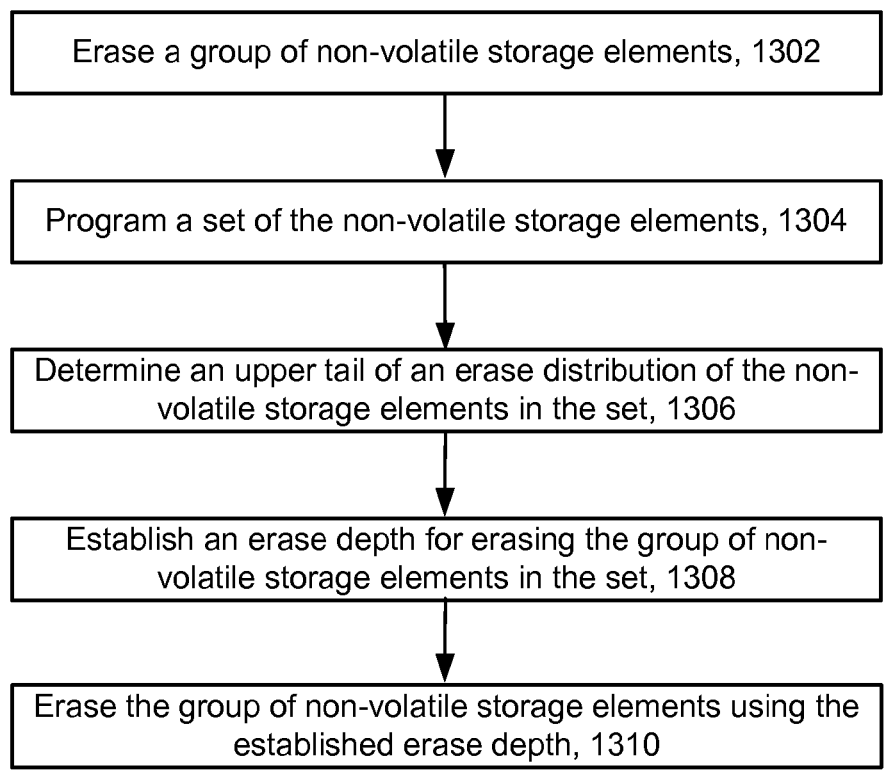
FIG. 13A is a flowchart of one embodiment of a process of erasing non-volatile storage using dynamic erase depth.

FIG. 13A is a flowchart of one embodiment of a process 1300 of erasing non-volatile storage using dynamic erase depth. The process is applied to a NAND architecture in one embodiment. The memory array is a 2D NAND memory array in one embodiment. The memory array is a 3D NAND memory array in one embodiment. The memory cells have floating gates, in one embodiment. The memory cells have charge storage regions (e.g., silicon nitride), in one embodiment.

Step 1302 includes erasing a group of non-volatile storage elements. In one embodiment, the group is a block of non-volatile storage elements; however, step 1302 is not limited to erasing a block. Techniques such as depicted in FIG. 8B or 8C could be used.

Step 1304 includes programming a set of the non-volatile storage elements in the group after erasing the group. Note that this set does not need to include all of the memory cells that were erased. The set that is programmed are non-volatile storage elements associated with a word line in the block, in one embodiment. It is not required that the entire word line be programmed. Also, more than one word line can be programmed.

Typically the memory cells are erased prior to programming them. The programming that is done to the set of memory cells in step 1304 refers to the programmed performed while those memory cells are still in the erased state. Note that this programming could occur at any time after the erase step.

Step 1306 includes determining an upper tail of an erase distribution of non-volatile storage elements in the set after the programming. This may include determining a location of the upper tail in terms of a $V_{TH}$. Note that step 1306 might be performed right after the programming step 1304. Thus, step 1306 determines an effect that the programming operation has on the upper tail of the erase distribution. In one embodiment, step 1306 includes determining erase state to A-state fails of non-volatile storage elements in the set after the programming.

Step 1308 includes establishing an erase depth for erasing the group of non-volatile storage elements based on the upper tail. This erase depth may be used the next time that the group of memory cells are erased, as well as other future erase procedures. In one embodiment, the erase depth is shallower when the upper tail is higher, and deeper when the upper tail is lower. In one embodiment, the erase depth is shallower when the number of erase state to A-state fails is higher, and deeper when the number of erase state to A-state fails is lower.

In one embodiment, an erase verify level is determined in order to establish the erase depth. The erase verify level may be higher when the upper tail is higher, and lower when the upper tail is lower. In one embodiment, the number of erase pulses to be used after erase verify passes is determined in order to establish the erase depth. More erase pulses can be used for a deeper erase, fewer for a shallower erase. The erase depth can also be established by a combination of selecting the erase verify level and the number of erase pulses to be used after erase verify passes.

Step 1310 includes erasing the group of group of non-volatile storage elements using the erase depth established in step 1308. In some cases, information from step 1306 and/or 1308 is stored so that it is available for the erase of step 1310.

Figure 13B:
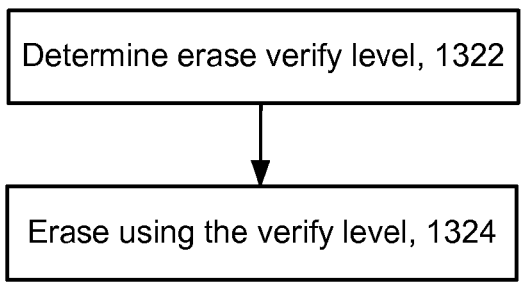
FIG. 13B is one embodiment of a process of erasing to achieve a desired erase depth that adjusts the erase verify level.

FIG. 13B is one embodiment of a process of erasing to achieve a desired erase depth that adjusts the erase verify level. This is one embodiment of step 1310 of FIG. 13A. In step 1322, a target erase verify level is determined based on the desired erase depth. Referring to FIG. 8A, the erase verify level Vev may be moved to a lower $V_{TH}$ to achieve a deeper erase or a higher $V_{TH}$ to achieve a shallower erase.

In step 1324, the memory cells are erased using the target erase verify level. There are numerous ways to achieve erasing with the target erase verify level. FIGS. 16A-20 provide further details for numerous techniques for modifying the sensing during an erase verify operation to archive the target erase verify level.

Figure 13C:
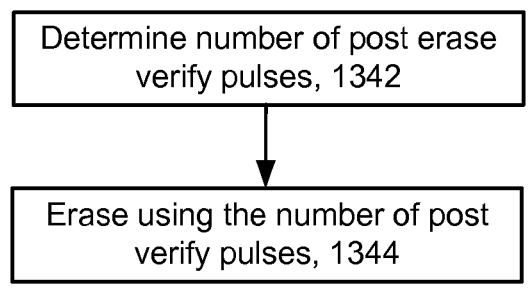
FIG. 13C is one embodiment of a process of erasing to achieve a desired erase depth that adjusts the number of erase pulses after verify passes.

FIG. 13C is one embodiment of a process of erasing to achieve a desired erase depth that adjusts the number of erase pulses after verify passes. This is one embodiment of step 1310 of FIG. 13A. In step 1342, a target number of erase pulses after verify passes is determined based on the desired erase depth. Referring to FIG. 9B, the number of "XEP" pulses may be increased to achieve a deeper erase or a decreased to achieve a shallower erase. In step 1344, the memory cells are erased using the number of "XEP" pulses. Note that the technique of FIG. 13C can be combined with the technique of FIG. 13B to achieve a target erase depth.

Figure 14A:
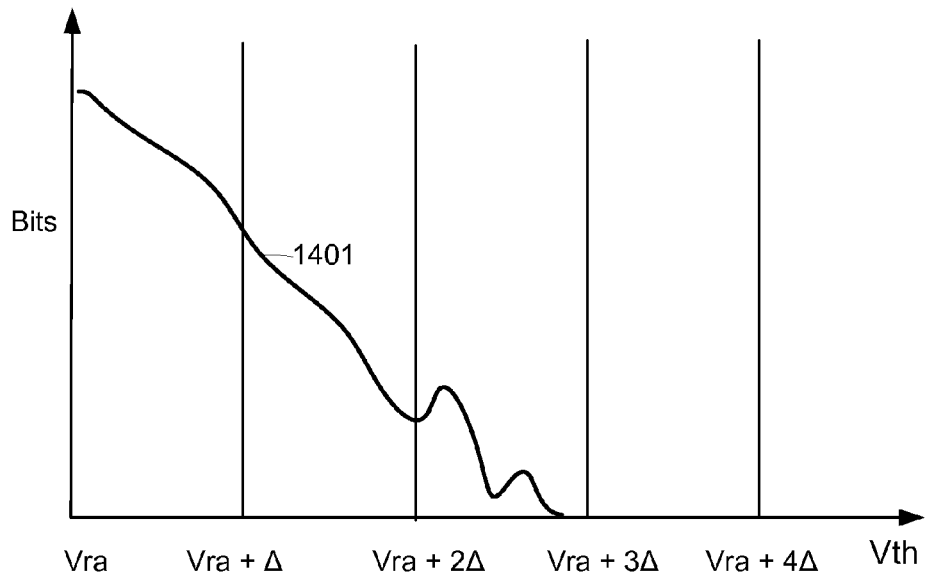
FIG. 14A is a graph that depicts an upper portion of an erase distribution after programming has occurred.

FIG. 14A is a graph that depicts an upper portion of an erase distribution 1401 after programming has occurred. The x-axis represents memory cell $V_{TH}$. The upper portion is just above the A state read level, in this example. The x-axis shows several reference voltages that are each one additional delta increment above the A state read level. Memory cells that should be in the erased state, but are read as being in the A-state (e.g. having a $V_{TH}$ above the A read level) are considered to be E to A failures.

The upper tail of the erase distribution can be defined as a point at which only a relatively small number of memory cells have a $V_{TH}$ above. For example, the point at which some threshold number of memory cells have a $V_{TH}$ above may be defined as the upper tail. As one specific example, the upper tail could be defined as the lowest point at which no more than about 64 memory cells have a $V_{TH}$ above.

The upper tail of the erase distribution can be defined in terms of the location at which the number of E to A failures is below some threshold number of fails. This assumes that the upper tail is located above the A-state read reference level (e.g., Vra). Referring to FIG. 14A, the upper tail could be defined as about Vra+2Δ. At Vra and Vra+Δ, the number of E to A failures is above the threshold, for the sake of illustration. However, at Vra+2Δ, the number of E to A failures is below the threshold. It is also true that at Vra+3Δ the number if E to A failures is below the threshold. However, by definition, the upper tail may be defined as the lowest of such read reference levels. The upper tail can be located with finer granularity by using a smaller Δ.

Figure 14B:
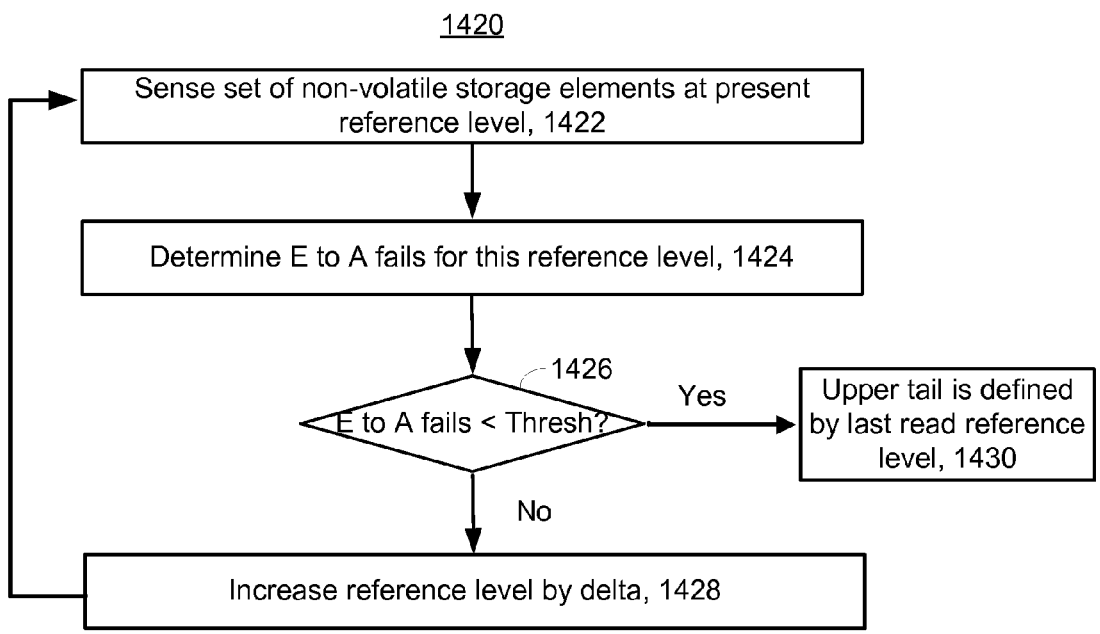
FIG. 14B is one embodiment of a process of determining an upper tail of an erase distribution.

FIG. 14B is one embodiment of a process 1420 of determining an upper tail of an erase distribution. Process 1420 is one embodiment of step 1306. Thus, process 1420 may be performed after a set of the memory cells have been programmed. In process 1420, the upper tail is determined based on a location some threshold number of E to A fails. FIG. 14A will be referred to when discussing process 1420.

In step 1422, set of memory cells are sensed at a first reference level near the A-state read reference level (e.g., Vra). In one embodiment, sensing begins at Vra. Typically, a read reference voltage is applied to a selected word line and NAND strings are sensed in response. The sensing determines which memory cells have a $V_{TH}$ greater than the first reference level. The set of memory cells under test can be associated with more than one word line. In this case, each word line can be tested in separately. That is, the first reference level is applied separately to the different word lines associated with the set of memory cells under test.

In step 1424, the number of E to A fails is determined for this reference level. In one embodiment, programming has just been completed and information is available stating which memory cells were intended to stay erased. This information may be available based on information in data latches in the sense amplifier. Thus, the E to A fails may be determined as the number of memory cells that should be in the erased state, but that had a $V_{TH}$ greater than the first reference level. Any memory cell that was programmed to a state other than the erased state need not be considered in this determination, for one embodiment of step 1424.

In step 1426, the number of E to A fails is compared to a threshold number. The comparison determines whether the number of E to A fails is less than the threshold number, in one embodiment. For simplicity of analysis, it will be assumed that the number of E to A fails is greater than the threshold number for the first pass.

In step 1428, the read reference level is increased by delta ($\Delta$). Delta could be any convenient increment. Then, the process returns to step 1422 to sense with the next reference level. The process repeats in this manner until the number of E to A fails is less than the threshold number. In the example of FIG. 14A, this occurs when the memory cells are read at Vra+2$\Delta$. The process then concludes at step 1430 in which the upper tail may be defined as Vra+2$\Delta$. Note that the upper tail can be defined with greater precision if the increment ($\Delta$) is smaller. Also, variations are possible, such as starting with a higher read reference level and decreasing by the increment each iteration.

Also note that there may be a relationship between the number of E to A fails and the location determined in step 1430. When there are more E to A fails, the upper tail of the erase distribution may be further to the right (higher $V_{TH}$). Conversely, when there are fewer E to A fails, the upper tail of the erase distribution may be further to the left (lower $V_{TH}$). Thus, although step 1430 may not determine the exact number of E to A fails, it may serve to provide information about the relative number of E to A fails. For example, if the E to A fails went under the threshold when reading at Vra+$\Delta$, this may indicate a relatively low number of E to A fails relative to the case in which the E to A fails went under the threshold when reading at Vra+2$\Delta$. On the other hand, if the E to A fails went under the threshold when reading at Vra+3$\Delta$, this may indicate a relatively high number of E to A fails relative to the case in which the E to A fails went under the threshold when reading at Vra+2$\Delta$. Thus, step 1430 may serve as one way to determine information about the upper tail of the erase distribution based on the number of E to A fails.

Figure 14C:
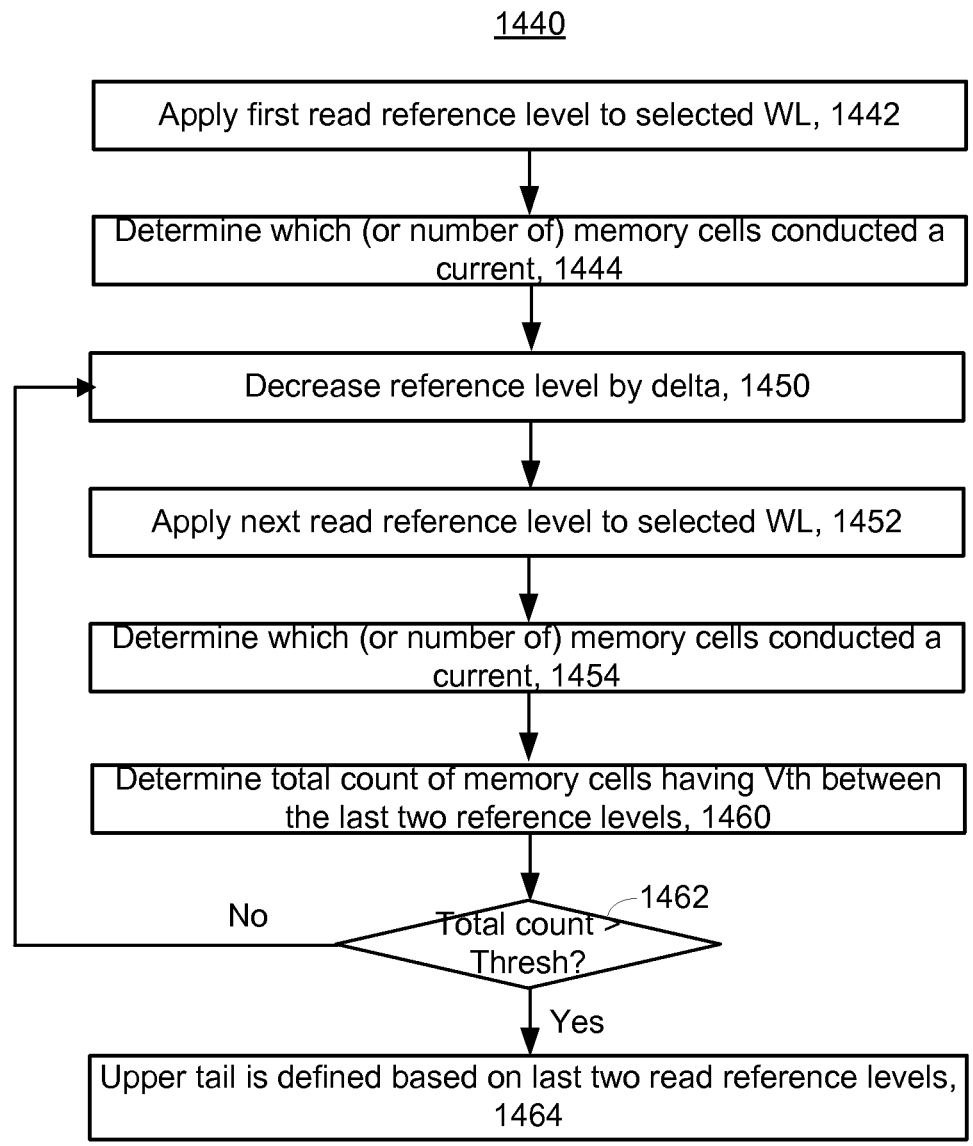
FIG. 14C is another embodiment of a process of determining an upper tail of an erase distribution.

FIG. 14C is one embodiment of a process 1440 of determining an upper tail of an erase distribution. Process 1440 is another embodiment of step 1306. Thus, process 1440 may be performed after a set of the memory cells have been programmed. In process 1440, the upper tail is determined based on comparing results of two reads near the A-state read reference level. FIG. 14A will be referred to when discussing process 1440. Process 1440 describes testing memory cells on a selected word line, but can be extended to test memory cells on multiple word lines.

In step 1442, a first reference level that is near the A-state read reference level is applied to a selected word line associated with the set of memory cells. As one example, sensing begins at Vra+4$\Delta$. In step 1444, a determination is made as to which memory cells conducted a current in response to the first reference level. In other words, a determination is made as to which memory cells have a $V_{TH}$ below the first reference level (and which have a $V_{TH}$ above the first reference level). Note that memory cells being referred to here may be just those that were intended to stay erased. In one embodiment, data latches in sense block 500 store results of step 1444.

In step 1450, the read reference level is decreased by some increment ($\Delta$). This can be any increment, and need not be related to the $\Delta$ used in FIG. 14B.

In step 1452, the next reference level is applied to the selected word line associated with the set of memory cells under test. As one example, occurs at Vra+3$\Delta$. In step 1454, a determination is made as to which memory cells conducted a current in response to the next reference level. In other words, a determination is made whether each memory cell has a $V_{TH}$ below/above the next reference level. Note that memory cells being referred to here may be just those that were intended to stay erased. In one embodiment, results of step 1454 are stored in data latches, without overwriting results from step 1444.

In step 1460, a count is made of the number of memory cells under test having a $V_{TH}$ between the last two reference voltages. Note that memory cells being referred to here may be just those that were intended to stay erased. This count can be made by subtracting the count of step 1441 from the count of 1458. In this process, the first reference voltage in step 1442 is higher than the next. Therefore, there should be fewer memory cells in the first count. In one embodiment, step 1460 involves a comparison of information stored in data latches in steps 1444 and 1454.

In step 1462, the count from step 1460 is compared to a threshold number. The comparison determines whether the number of memory cells having a $V_{TH}$ between the two reference voltages is greater than the threshold number, in one embodiment. If so, the upper tail of the erase threshold distribution has been found. Referring to FIG. 14A, there are not enough memory cells having a $V_{TH}$ between Vra+3$\Delta$ and Vra+4$\Delta$ for this test to pass. However, when testing between Vra+2$\Delta$ and Vra+3$\Delta$, there may be enough for the test to pass. Therefore, the upper tail could be established at Vra+2$\Delta$, as one example. An alternative is to define the upper tail location as some point between Vra+2$\Delta$ and Vra+3$\Delta$, inclusive of either end point.

Assuming that the test of step 1462 does not pass, the process returns to step 1450 to decrease the reference voltage. Steps 1452-1462 are then repeated. In this iteration, the comparison is testing for the memory cells having a $V_{TH}$ between Vra+2$\Delta$ and Vra+3$\Delta$. As noted above, for the sake of example, the test may pass in which case the process ends.

Figure 14D:
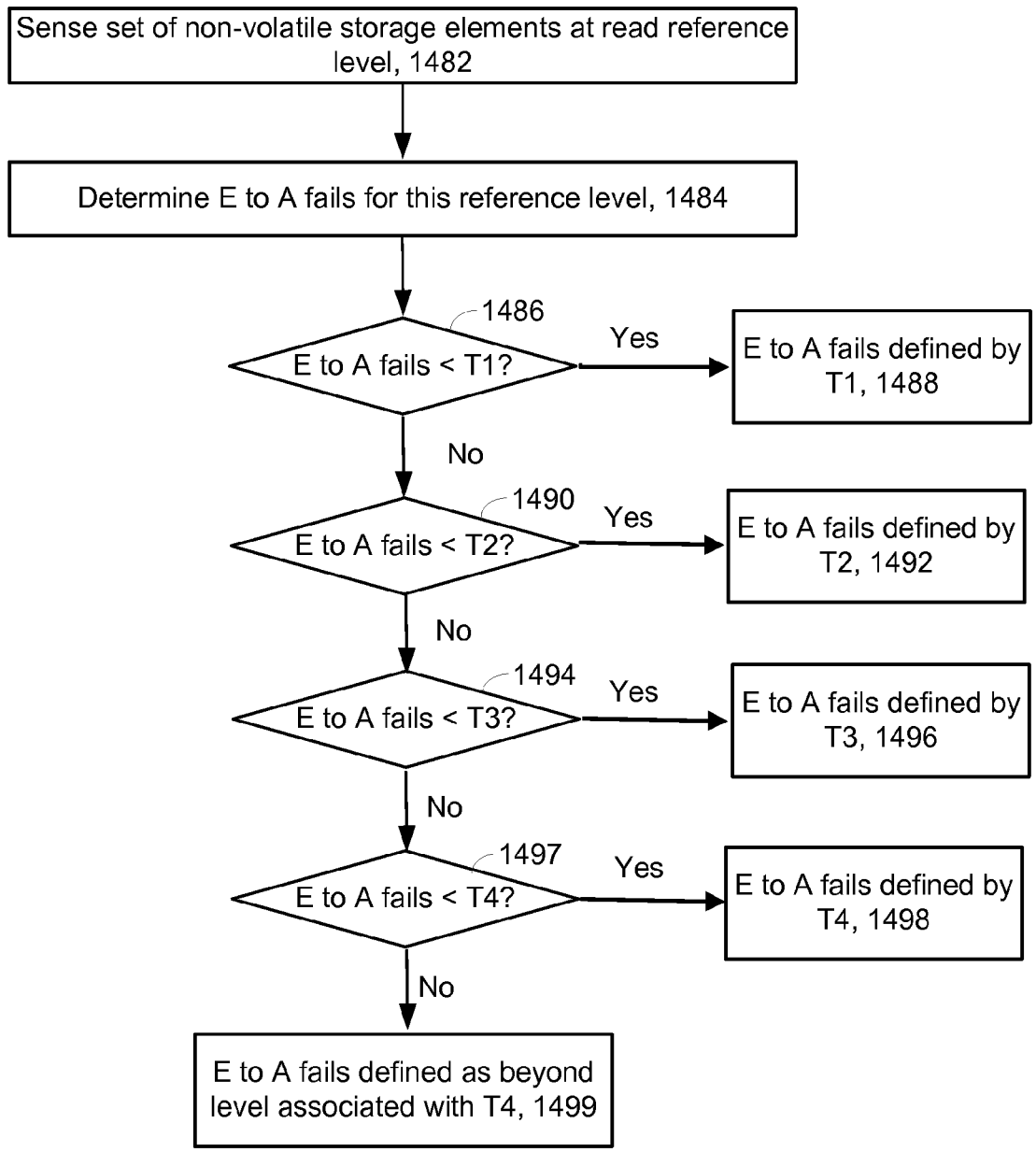
FIG. 14D is a flowchart of one embodiment of a process of determining E to A fails.

FIG. 14D is a flowchart of one embodiment of a process 1480 of determining E to A fails. The number of E to A fails is one way to determining an upper tail of the erase distribution of step 1306 of FIG. 13A. In process 1480, the number of E to A fails are compared to multiple threshold values. In this process T1-T4 are used, but any other number could be used. In this example, T4>T3>T2>T1.

In step 1482, the set of memory cells are sensed at a read reference level. This may be a level to test a $V_{TH}$ somewhere near the A-state read reference level. In one embodiment, it is at the A-state read reference level. In one embodiment it is slightly higher than the A-state read reference level.

In step 1484, the number of E to A fails is determined. This may be performed similar to as previously described in step 1424 of FIG. 14A. In step 1486, the E to A fails are compared to T1. If the E to A fails are less than T1, then the E to A fails are defined at step 1488 based on T1. Otherwise, the E to A fails are compared to T2, in step 1490. If the E to A fails are less than T2, then the E to A fails are defined at step 1492 based on T2. Otherwise, the E to A fails are compared to T3, in step 1494. If the E to A fails are less than T3, then the E to A fails are defined at step 1496 based on T3. Otherwise, the E to A fails are compared to T4, in step 1497. If the E to A fails are less than T4, then the E to A fails are defined at step 1498 based on T4. If the E to A fails are not less than T4, then the E to A fails are defined at step 1499 as being greater than a level associated with T4.

Figure 15A:
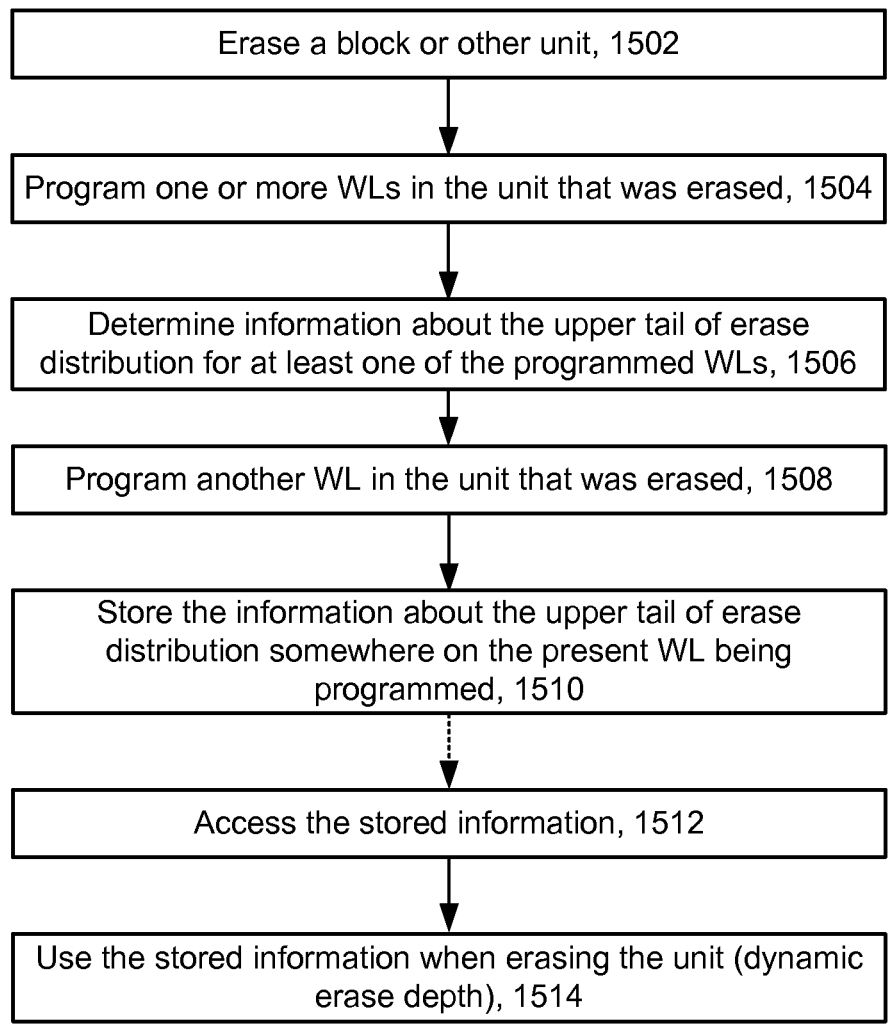
FIG. 15A is one embodiment of a process is storing information about the upper tail of the erase distribution in association with one of the word lines in the unit being erased.

In some embodiments, information about the upper tail of the erase distribution is stored so that it is available for the next erase process. FIG. 15A is one embodiment of a process 1500 is storing information about the upper tail of the erase distribution in association with one of the word lines in the block being erased. In step 1502, a block or other unit of memory cells is erased. In step 1504, one or more of the word lines in the unit that was erased is programmed. In step 1506, information about the upper tail of the erase distribution of at least one of the programmed word lines is determined. Processes such as those depicted in FIG. 14B or 14C could be used to determine this information. The information could be an erase verify level, a number or erase pulses to use after erase verify passes, or some other information. This information might simply be information that was collected, such as the location of the upper tail of the erase distribution, the number of memory cells having a $V_{TH}$ above some level or within same range, etc.

In step 1508, another word line in the unit that was erased is programmed. In step 1510, the information about the upper tail of the erase distribution is stored in association with the word line presently being programmed. This may be stored in a memory cell on the word line that is reserved for system use, as one example.

In step 1512, the information about the upper tail of the erase distribution is accessed from the stored location. Additionally, an erase depth may be determined based on the information, if the erase depth is not specified in the information. The erase depth could be specified in the information by one or more parameters that specify the erase verify level and or number of erase pulses after erase verify passes. A dashed line is depicted between steps 1510 and 1512 to indicate that a substantial amount of time may pass between these steps. In step 1514, the accessed information is used when erasing the unit of memory cells.

Figure 15B:
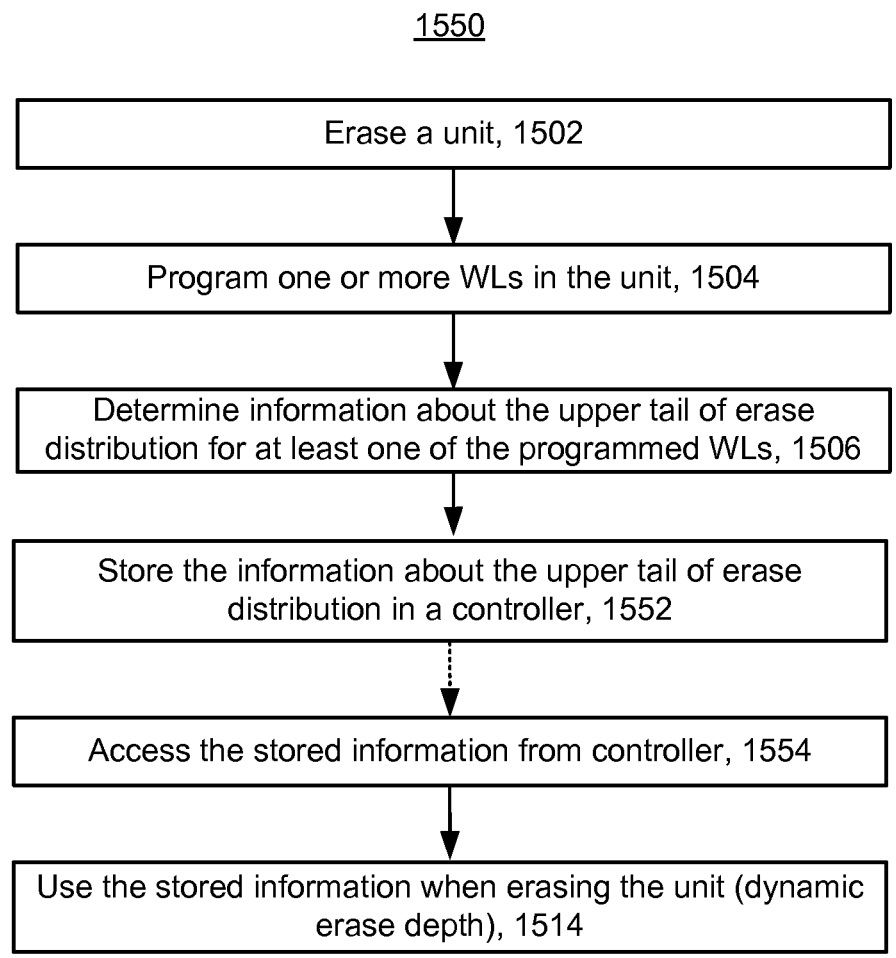
FIG. 15B is one embodiment of a process of storing information about the upper tail of the erase distribution in a controller.

FIG. 15B is one embodiment of a process 1550 of storing information about the upper tail of the erase distribution in a controller. Steps that are similar to process 1500 will use the same reference numeral. In step 1502, a unit of memory cells is erased. In step 1504, one or more of the word lines in the unit is programmed. In step 1506, information about the upper tail of the erase distribution of at least one of the programmed word lines is determined. In step 1508, another word line in the unit is programmed. In step 1552, the information about the upper tail of the erase distribution is stored in a controller 550. The controller 550 is off the memory chip 598, in one embodiment. However, the controller may be on chip. In step 1554, the information about the upper tail of the erase distribution is accessed from the controller 550. Additionally, an erase depth may be determined based on the information. A dashed line is depicted between steps 1552 and 1554 to indicate that a substantial amount of time may pass between these steps. In step 1514, the accessed information is used when erasing the unit.

Techniques to Adjust Sensing to Achieve Erase Verify Level

One technique to dynamically adjust the erase depth is to select an erase verify level. Numerous techniques can be used to achieve verifying using a target erase verify level. The following section describes numerous techniques for modifying how sensing is performed during an erase verify operation to achieve the target erase verify level.

Figure 16A:
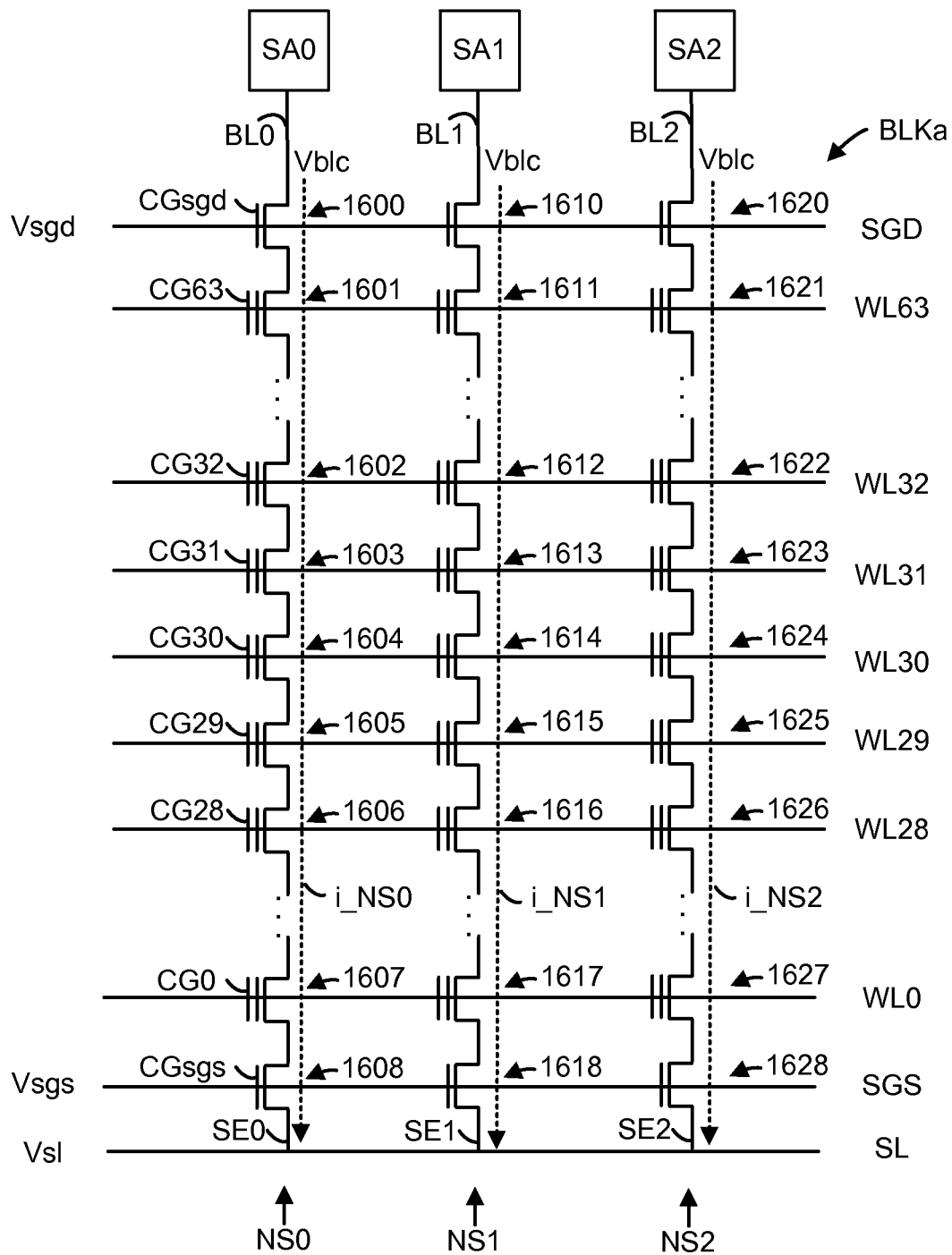
FIG. 16A depicts current flow in NAND strings during an example "all bit line" sensing process of an erase operation.

FIG. 16A depicts current flow in NAND strings during an example all bit line sensing process of an erase operation. BLKa includes example NAND strings NS0-NS2 and associated sense amplifiers SA0-SA2, respectively, connected to bit lines BL0-BL2, respectively. An SGD line is connected to control gates of SGD transistors 1600 (having example control gate CGsgd), 1610 and 1620. WL63 is connected to control gates of storage elements 1601 (having example control gate CG63), 1611 and 1621. WL32 is connected to control gates of storage elements 1602 (having example control gate CG32), 1612 and 1622. WL31 is connected to control gates of storage elements 1603 (having example control gate CG31), 1613 and 1623. WL30 is connected to control gates of storage elements 1604 (having example control gate CG30), 1614 and 1624. WL29 is connected to control gates of storage elements 1605 (having example control gate CG29), 1615 and 1625. WL28 is connected to control gates of storage elements 1606 (having example control gate CG28), 1616 and 1626. WL0 is connected to control gates of storage elements 1607 (having example control gate CG0), 1617 and 1627. An SGS line is connected to control gates of SGS transistors 1608 (having example control gate CGsgs), 1618 and 1628. The source ends SE0-SE2 of NS0-NS2, respectively, are connected to a common source line SL.

The sensing can be used to determine whether an erase operation is completed for a block.

In an example sensing process referred as negative all bit line sensing, the current is sensed concurrently in each NAND string in a block, by the sense amplifiers associated with those NAND strings. For example, the current in NS0, NS1 and NS2 is i_NS0, i_NS1 and i_NS2, respectively, as sensed by sense amplifiers SA0, SA1 and SA2, respectively. Further, in a first approach, the storage elements of all of the word lines are verified concurrently. For example, to determine whether an erase operation is completed for a block, WL0-WL63 can receive Vev such as 0V. In a second approach, the storage elements of even-numbered word lines are verified concurrently, after which the storage elements of odd-numbered word lines are verified concurrently. When the storage elements of even-numbered word lines are verified, WL0, WL2, WL62 can receive Vev or Vv_dem while WL1, WL3, WL63 can receive Vread. In a third approach, the storage elements of odd-numbered word lines are verified concurrently, after which the storage elements of even-numbered word lines are verified concurrently. Thus, regardless of whether all bit line sensing or even/odd (source-follower) sensing is used, a further option is to verify even-numbered and odd-numbered word lines together (referred to as all word line erase-verify) or to verify the even-numbered and odd-numbered word lines separately (referred to as alternate word line erase-verify). Verifying the even-numbered and odd-numbered word lines separately may improve write-erase endurance.

Vsl can be set to a level which is lower than Vbl so that a current flows from the drain end to the source end of a NAND string. In one example, Vsl=1.2 V and the bit lines are held at Vbl=1.8 V. The current in each NAND string flows through the associated bit lines and is sensed at the associated sense amplifier. If the sensed current exceeds a threshold or trip level (Itrip), the NAND string is judged to be in a conductive state. If the sensed current does not exceed the trip level, the NAND string is judged to be in a non-conductive state. The value of Itrip is determined by a sensing time (tsense) which can be set based on a ROM fuse parameter in the memory device. In one approach, Isense is inversely proportional to tsense.

An erase-verify test is judged to be passed when all, or almost all of the NAND strings (except for a small number of NAND strings which might be ignored), are judged to be in a conductive state. The erase depth can be controlled by setting Vsl. A higher Vsl results in a deeper erased depth because it makes the erase-verify test stricter (more difficult to pass, requiring more erase loops). Note that modifying Vsl effectively modified the erase verify level. For example, this effectively modifies Vev in FIG. 8A.

The SGD line and SGS line receive voltages Vsgd and Vsgs, respectively, which render these transistors in a conductive state.

Even though the sensing can be done in a different manner for the negative all bit line sensing scheme and source follower sensing scheme, for both schemes, the judgment of whether the NAND string in conductive or non-conductive is determined by the amount of current flowing through the NAND string. The NAND string current is inversely proportional to the NAND string resistance. At each erase pulse, Verase is increased to erase the storage elements deeper, lowering their Vth and hence reducing the NAND string resistance. After a certain erase pulse, when the NAND string resistance reaches a sufficiently low value, the NAND string will be judged to be conductive, and the erase-verify test will be passed.

Figure 16B:
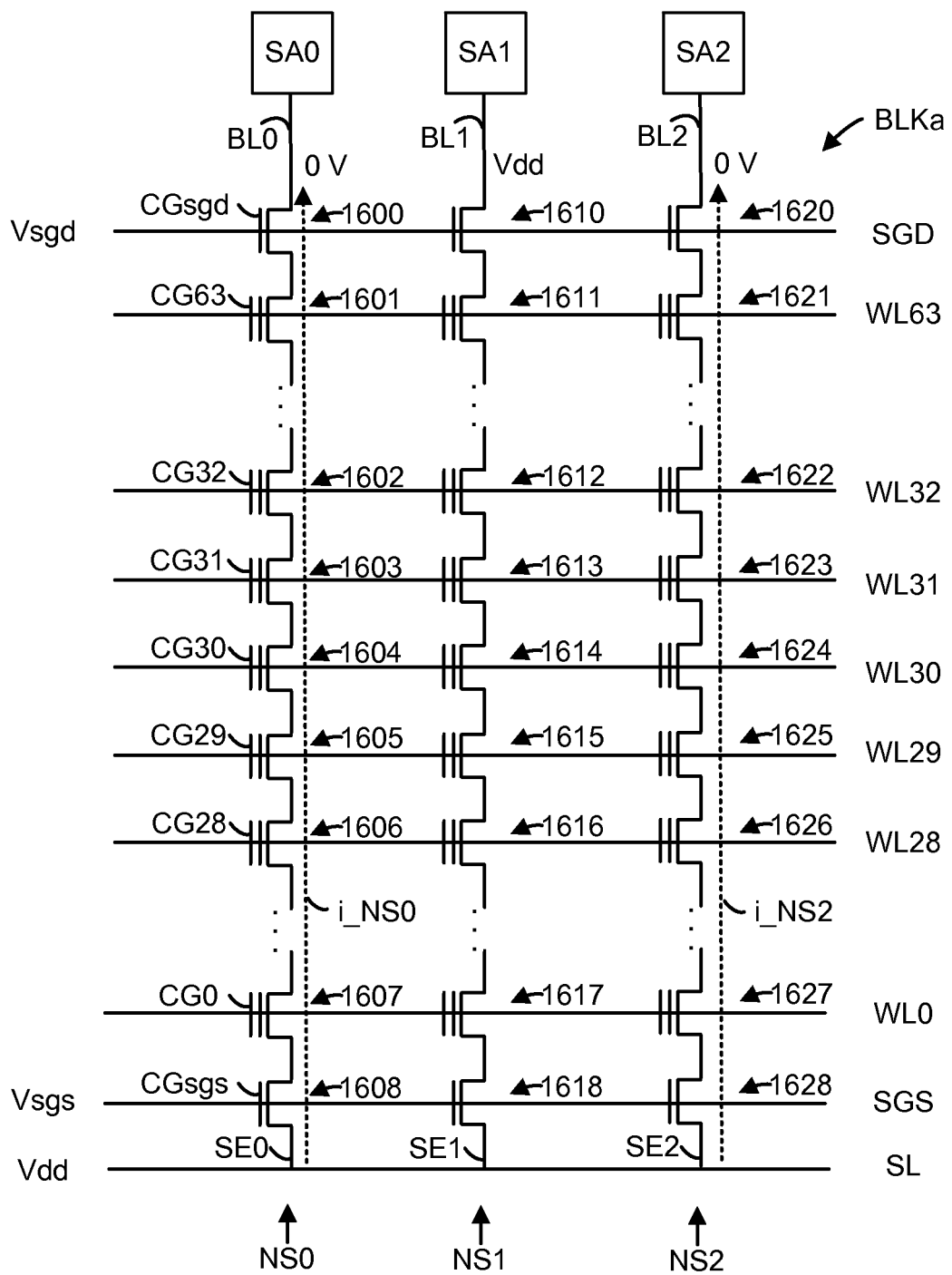
FIG. 16B depicts current flow in NAND strings during a sensing process of even-numbered bit lines in connection with an erase operation.

FIG. 16B depicts current flow in NAND strings during a sensing process of even-numbered bit lines in connection with an erase operation. Another type of sensing is source-follower sensing in which the SL is charged up to Vdd (e.g., 2.5 V) and the bit lines to be sensed (even-numbered bit lines in this example) are initially grounded. The SGD transistors are biased high enough to make them conductive, so that the NAND string cell current can flow through them. In this technique, the even- and odd-numbered bit lines can be verified separately to avoid the effects from neighboring bit line coupling. When even-numbered bit lines are verified, the odd-numbered bit lines are held at Vdd, to avoid unwanted current flowing through the odd-numbered bit lines. Similarly, when odd-numbered bit lines are verified, the even-numbered bit lines are held at Vdd. NAND string current flows from the source side to the drain side of a NAND string as indicated by currents i_NS0 and i_NS2 for NS0 and NS2, respectively. During sensing, the bit lines to be sensed, are left floating and are charged up because of current following from the source side to the drain side of the NAND string. After waiting for a certain time, the final Vbl level to which the bit line is charged is judged by the sense amplifier. The NAND string is judged to be in a conductive state if Vbl>Vtrip, where Vtrip can be set based on a ROM fuse parameter in the memory device.

An erase-verify test is judged to be passed when all, or almost all of the NAND strings (except for a small number of NAND strings which might be ignored), are judged to be in a conductive state. The erase depth can be controlled by setting Vtrip. A higher trip voltage results in a deeper erased depth because it makes the erase-verify test stricter and difficult to pass. See FIGS. 19A and 19B for further details. Also, the erase depth can be controlled by setting Vdd. A lower Vdd results in a deeper erased depth because it makes the erase-verify test stricter.

Figure 16C:
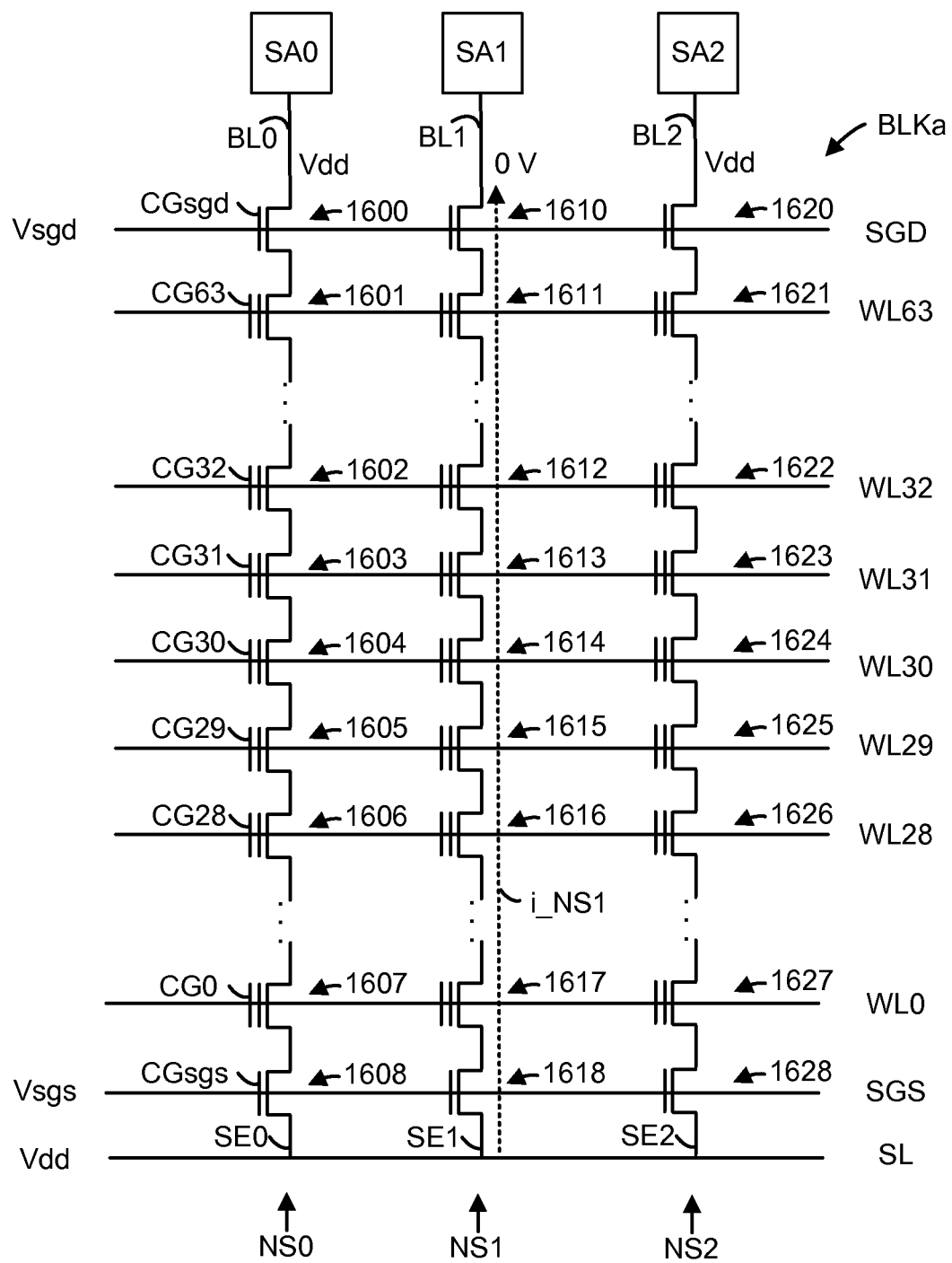
FIG. 16C depicts current flow in NAND strings during a sensing process of odd-numbered bit lines in connection with an erase operation.

FIG. 16C depicts current flow in NAND strings during a sensing process of odd-numbered bit lines in connection with an erase operation, which in one approach is performed after a sensing process of even-numbered bit lines. When odd-numbered bit lines are verified, the even-numbered bit lines are held at Vdd. NAND string current flows from the source side to the drain side of a NAND string as indicated by current i_NS 1 for NS 1.

Figure 17:
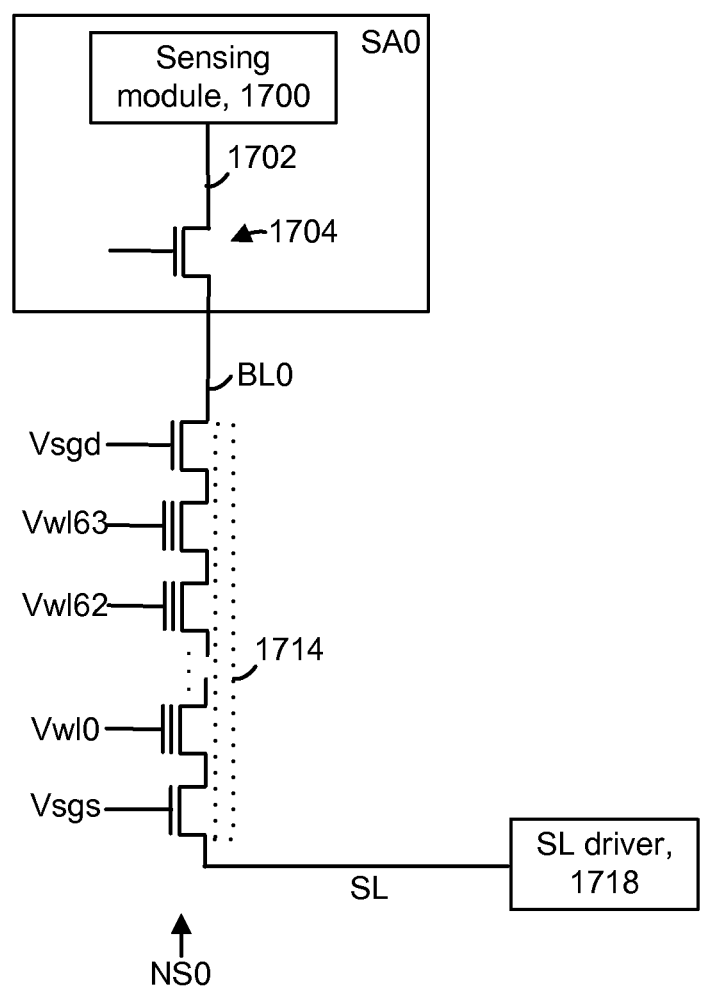
FIG. 17 depicts an example sensing circuit which includes the sense amplifier SA0 and NAND string NS0 of FIG. 3.

FIG. 17 depicts an example sensing circuit which includes the sense amplifier SA0 and NAND string NS0 of FIG. 3. NS0 is fabricated on a substrate and includes a channel region 1714 in the substrate. SA0 includes a sensing module 1700, a sense line 1702 and a transistor 1704 which is connected to BL0. A voltage on the bit line can be fixed or clamped to a desired level using the transistor 1704. A SL driver 1718 provides a voltage Vsl on the SL. In the all bit line sensing described in connection with FIG. 16A, the SL driver is used to set Vsl and the transistor 1704 is used to set Vbl. The transistor 1704 may be referred to as a bit line clamp (BLC) transistor. Depending on the conductive states of the storage elements in NS0, current may flow in the channel 1714 from the BL to the SL through the sense line. The sensing module can determine the amount of current (or at least, whether the current amount is below or above a certain current-trip level i.e., Itrip) on the sense line 1702 in different ways. In one possible approach, the sense module has a capacitor which is charged up. At t0, the capacitor is allowed to charge the sense line to a specified level. The voltage level is then determined to be above or below a trip voltage at a sense time. The current is determined to be above or below a trip current at the sense time according to whether the voltage level is below or above, respectively, the trip voltage. The sense module thus determines the current by pre-charging the sense line and subsequently determining a voltage drop which is tied to the current level. The sensing parameters can be adjusted by adjusting the pre-charge level or a trip level for the voltage drop.

Figure 18A:
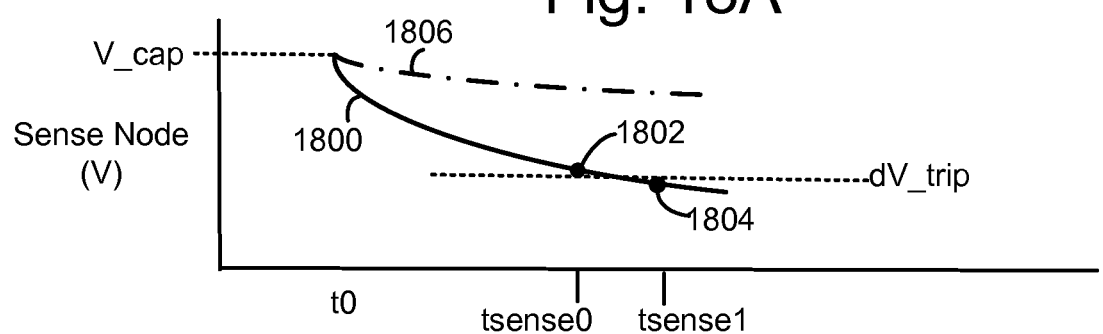
FIG. 18A depicts a sensed current for the sensing scheme of FIG. 16A, where a current sense time is an adjustable parameter.

FIG. 18A depicts curves when sensing a current for the sensing scheme of FIG. 16A, where a current sense time is an adjustable parameter. The bit line voltage may be held constant during sensing. Therefore, a fixed current may flow through the NAND string during sensing. In one embodiment, the NAND string current discharges a sense node in the sense amplifier for a time period referred to as a "sense time." A determination is made whether the voltage on the sense node discharges to a certain level within the sense time. The sense node may have a known capacitance (C), such that the NAND string current can be determined by I=C dV/dt. In this equation, I is the NAND string current, dV is the drop in voltage on the sense node, and dt is the sense time. Thus, a greater NAND string current can be tested for by either increasing dV or by decreasing the sense time (dt).

FIG. 18A depicts the voltage at the sense node versus sense time. A line 1800 represents a case where the NAND string is in a conductive state and a relatively large current flows. Thus, the voltage at the sense node discharges by a large amount. A line 1806 represents a case where the NAND string is in a non-conductive state and a relatively small current flows. Each case starts with V_cap on the sense node. The voltage on the sense node needs to drop to dV_trip to reach the demarcation point. The difference between these two voltages is dV in the above equation. If the voltage reaches or falls past this demarcation point by the sense time, then the NAND string current is at least "I_sense."

At a sense time tsense0 or tsense1, line 1800 has a value at point 1802 (above a trip point dV_trip) or 1804 (below dV_trip), respectively. A shorter sense time (tsense0) means that more current needs to flow to reach dV_trip (e.g., I_sense=dV/tsense), while a longer sense (tsense1) time means that less current needs to flow to reach dV_trip. Thus, a longer sense time makes the erase-verify easier to pass, resulting in a shallower erased depth.

Figure 18B:
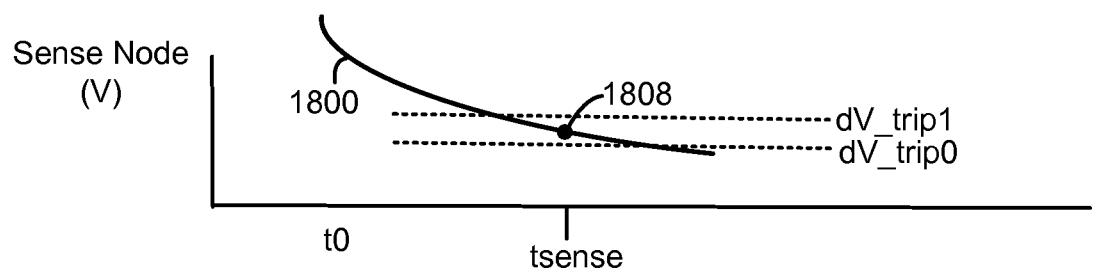
FIG. 18B depicts a sensed current for the sensing scheme of FIG. 16A, where a current trip level is an adjustable parameter.

FIG. 18B depicts a sensed current for the sensing scheme of FIG. 16A, where a trip level is an adjustable parameter. The line 1800 is repeated. At a sense time tsense, line 1800 has a value at point 1808 which is above dV_trip0 but below dV_trip1. Thus, a relatively lower dV_trip (dV_trip0) results in a determination that the NAND string is in a non-conductive state, while a relatively higher dV_trip (dV_trip1) results in a determination that the NAND string is in a conductive state. Thus, a higher dV_trip (dV_trip1) makes the erase-verify easier to pass, resulting in a shallower erased depth.

Figure 19A:
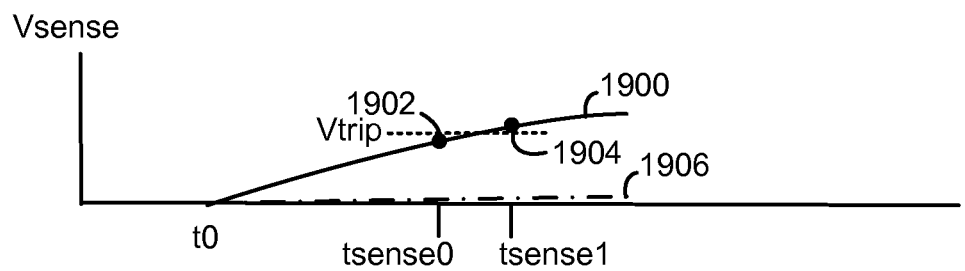
FIG. 19A depicts a sensed voltage for the sensing scheme of FIGS. 16B and 16C, where a voltage sense time is an adjustable parameter.

FIG. 19A depicts a sensed voltage for the sensing scheme of FIGS. 16B and 16C, where a voltage sense time is an adjustable parameter. During sensing of even- or odd-numbered bit lines, Vbl is sensed after Vsl is raised at t0. A line 1900 represents a case where the NAND string is in a conductive state and a relatively large voltage (Vbl) is sensed. A line 1906 represents a case where the NAND string is in a non-conductive state and a relatively small Vbl is sensed. At a sense time tsense0 or tsense1, line 1900 has a value at point 1902 (below a trip voltage Vtrip) or 1904 (above Vtrip), respectively. Thus, a relatively shorter sense time (tsense0) results in a determination that the NAND string is in a non-conductive state since Vsense<Vtrip, while a relatively longer sense time (tsense1) results in a determination that the NAND string is in a conductive state since Vsense>Vtrip. Thus, a longer tsense makes the erase-verify easier to pass, resulting in a shallower erased depth.

Figure 19B:
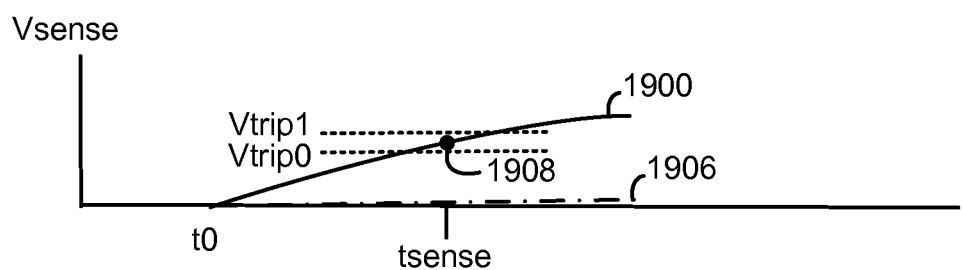
FIG. 19B depicts a sensed voltage for the sensing scheme of FIGS. 16B and 16C, where a voltage trip level is an adjustable parameter.

FIG. 19B depicts a sensed voltage for the sensing scheme of FIGS. 16B and 16C, where a voltage trip level is an adjustable parameter. The lines 1900 and 1906 are repeated. At a sense time tsense, line 1900 has a value at point 1908 which is above Vtrip0 but below Vtrip1. Thus, a relatively higher Vtrip (Vtrip1) results in a determination that the NAND string is in a non-conductive state, while a relatively lower Vtrip (Vtrip0) results in a determination that the NAND string is in a conductive state. Thus, a lower Vtrip makes the erase-verify easier to pass, resulting in a shallower erased depth.

Figure 19C:
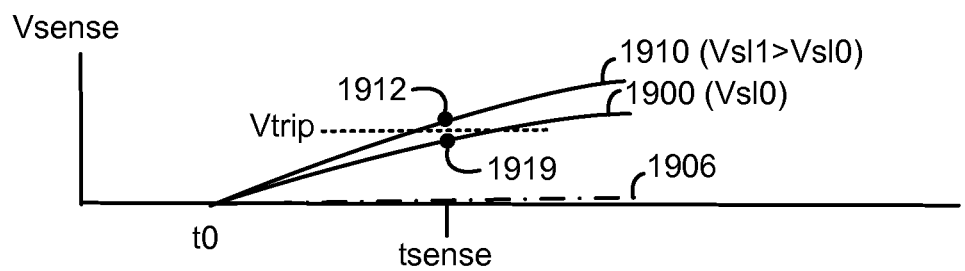
FIG. 19C depicts sensed voltages for the sensing scheme of FIGS. 16B and 16C, where a level of Vsl is an adjustable parameter.

FIG. 19C depicts sensed voltages for the sensing scheme of FIGS. 16B and 16C, where a level of Vsl is an adjustable parameter. The lines 1900 and 1906 are repeated. Line 1900 represents a case where Vsl=Vsl0, and line 1910 represents a case where Vsl=Vsl1>Vsl0. At a sense time tsense, line 1900 has a value at point 1914 which is below Vtrip and line 1910 has a value at point 1912 which is above Vtrip. Thus, a relatively lower Vsl (Vsl0) results in a determination that the NAND string is in a non-conductive state, while a relatively higher Vsl (Vsl1) results in a determination that the NAND string is in a conductive state. Thus, a higher Vsl makes the erase-verify easier to pass, resulting in a shallower erased depth.

FIG. 20 depicts an example process for adjusting sensing parameters based on an erase verify level. As disclosed, adjusting the erase verify level is one way of dynamically adjusting depth of erase. Step 2006 involves adjusting the sensing based on the erase verify level. Sensing that is relatively stricter results in a relatively deeper erase depth at which the erase-verify sensing passes successfully, e.g., a lower $V_{TH}$, in the erased storage elements. Step 2006 can be implemented by one or more of the other steps. For example, these steps include: Adjust trip level referred to as dV_trip in FIG. 18A-B (lower to make sensing stricter for all bit line sensing), 2000; Adjust voltage trip level (higher to make sensing stricter for even/odd bit line sensing), 2002; Adjust Vev (lower to make sensing stricter), 2004; Adjust Vread (lower to make sensing stricter), 2006; Adjust sense time (shorter to make sensing stricter), 2008; Adjust Vbl (lower to make sensing stricter for all bit line sensing), 2010; and Adjust Vsl (lower to make sensing stricter for separate even/odd bit line sensing), 2012.

Regarding step 2000, FIG. 18B provides examples of different current levels dV_trip0 and dV_trip1. Additional trip levels could be used as well. The erase-verify test of the sensing is stricter if dV_trip is lower, for a given tsense. Note that a lower dV_trip refers to a greater drop of voltage on the sense node, in the example provided above.

Regarding step 2002, FIG. 19B provides examples of different voltage trip levels Vtrip0 and Vtrip1. Additional voltage trip levels could be used as well. The erase-verify test of the sensing is stricter if Vtrip is higher, for a given tsense.

Regarding step 2004, FIG. 8A provides an example of Vev, the erase-verify voltage. The erase-verify test of the sensing is stricter if Vev is lower, since the storage elements need to be erased more deeply to pass the erase-verify test.

Regarding step 2008, FIGS. 18A and 19A provide examples of different sense times tsense0 and tsense1. Additional sense times could be used as well. The erase-verify test of the sensing is stricter if tsense is lower, for a given dV_trip (FIG. 18A) or Vtrip (FIG. 19A).

Regarding step 2010, in FIGS. 18A-18C, I is generated in proportion to Vbl, at a fixed Vsl. So, I will be greater when Vbl is greater, at a fixed Vsl. The erase-verify test of the sensing is stricter if Vbl is lower, for a given Itrip and tsense.

Regarding step 2012, for the even/odd bit line sensing discussed in connection with FIGS. 19A-19C, Vsense is generated in proportion to Vsl, so Vsense will be greater when Vsl is greater. The erase-verify test of the sensing is stricter if Vsl is lower, for a given Vtrip and tsense.

Dynamic Erase Depth Based on Programming Factors

The depth of erase may be determined based on programming factors. In one embodiment, the erase depth is determined based on how many program loops it takes to complete programming. For some devices, the number or program loops needed drops with further W/E cycles. This technique does not require determining the upper tail of the erase distribution after programming. However, it may be combined with such a technique to determine a suitable erase depth.

Figure 21:
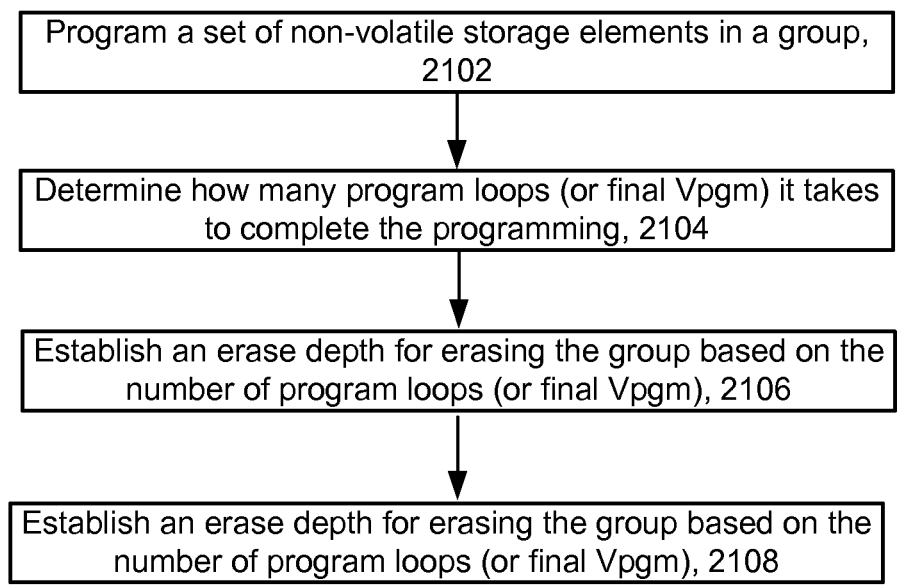
FIG. 21 is a flowchart of a process of dynamically adjusting erase depth for a group of memory cells based on program loops.

FIG. 21 is a flowchart of a process 2100 of dynamically adjusting erase depth for some group of memory cells based program loops. This group could be a block, but is not so limited. The memory cells could have floating gates. The memory cells could have charge storage regions, such as SiN. The process can be performed with 2D NAND, 3D NAND, etc.

In step 2102, a set of the non-volatile storage elements in the group are programmed. In one embodiment, the set are memory cells associated with one or more word lines.

In step 2104, a determination is made as to how many program loops it takes to complete the programming. For some devices, programming is performed one word line at a time. Thus, there can be a final loop count for each word line (or other unit) that is programmed. The counts for the different programming units can be averaged, as one example. Other statistical techniques can be used to derive a single loop count value in this step. Clearly, the program loop count is not required to be an integer. The program voltage may be incremented during the programming process. An alternative to monitoring program loops is to determine what final program voltage is used.

In step 2106, an erase depth is established for erasing the group of non-volatile storage elements based on how many program loops it takes to complete the programming. In one embodiment, the erase depth is made shallower when there are fewer program loops. Conversely, a greater number of program loops indicates a deeper erase.

The erase depth could also be established based on the final program voltage. As shown in FIG. 6, the magnitude of the program pulse (Vpgm) may be incremented with each program loop (or at least some program loops).

The erase depth can be achieved by selecting the erase verify level, as already discussed. The erase depth can be achieved by selecting the number of erase pulses after erase verify passes, as already discussed.

In step 2108, the group of memory cells are erased to the erase depth. Note that there may be a large gap in time between programming in step 2102 and erase in step 2108. Thus, the information learned in step 2104 and/or the erase depth that was determined in step 2106 may be stored. Such information could be stored in word line being programmed, or the controller, similar to processes in FIGS. 15A and 15B.

Example 3D Memory Device

FIG. 22 depicts a cross-sectional view of a block of a 3D non-volatile memory device. Dynamic erase depth techniques disclosed herein may be used within such a device. FIG. 22 has 12 NAND strings (NSA0-NSA11). The stack 2277 includes alternating insulator (e.g., dielectric) and conductor layers (a conductor layer may be one that is formed from one or more conductors). In one embodiment, the insulator layers are an oxide. However, a different insulator could be used. The insulator layers include D0 to D8 and may be made of $SiO_2$, for instance. The conductor layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. These various layers may also be referred to herein as layers L0-L16. The insulator layers D0-D8 correspond to the even layers of L0-L16, in this example. The conductor layers correspond to the odd layers L1-L15, in this example.

Columns of memory cells C0 to C23 are depicted in the multi-layer stack. The stack 2277 includes the substrate 2190, an insulating film 2109 on the substrate, and a back gate layer BG, which is a conductor layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 2263 which connect the columns. Each connecting portion 2263 thus connects the two columns of each U-shaped NAND string. A connection portion 2263 may include a pipe connection and a back gate. The pipe connection may be made of undoped polysilicon, as well as other materials. A back gate may surround the pipe connection to control conduction of the pipe connection. The back gate may also ensure connectivity of the pipe connection. For example, NSA0 includes columns C0 and C1 and connecting portion 2263. NSA0 has a drain end 2278 and a source end 2302. NSA1 includes columns C2 and C3 and connecting portion 2263. NSA1 has a drain end 2306 and a source end 2304. NSA2 includes columns C4 and C5 and connecting portion 2263. NSA3 includes columns C6 and C7 and connecting portion 2263. NSA4 includes columns C8 and C9 and connecting portion 2263. NSA5 includes columns C10 and C11 and connecting portion 2263. NSA6 includes columns C12 and C13 and connecting portion 2263. NSA7 includes columns C14 and C15 and connecting portion 2263. NSA8 includes columns C16 and C17 and connecting portion 2263. NSA9 includes columns C18 and C19 and connecting portion 263. NSA10 includes columns C20 and C21 and connecting portion 2263. NS 11 includes columns C22 and C23 and connecting portion 2263.

The source line SLA0 is connected to the source ends 2302 and 2304 of two adjacent memory strings NSA0 and NSA1, respectively. The source line SLA0 is also connected to other sets of memory strings which are behind NSA0 and NSA1 in the x direction. Additional U-shaped NAND strings in the stack 2277 extend behind the U-shaped NAND strings depicted in the cross-section, e.g., along the x-axis. The U-shaped NAND strings NSA0 to NSA1 are each in a different sub-block, but are in a common set of NAND strings (SetA0).

A slit portion 2208 is also depicted as an example. In the cross-section, multiple slit portions are seen. Some slit portions are between the drain- and source-side columns of a U-shaped NAND string. These slits serve to separate word lines on the source and drain side of the NAND string. Other slit portions are between the source-sides of two adjacent NAND strings. Other slit portions are between the drain-sides of two adjacent NAND strings. The slits between two adjacent NAND strings are not required. Portions of the source lines SLA0-SL5 are also depicted. A portion of the bit line BLA0 is also depicted. Short dashed lines depict memory cells and select gates. The memory cells can include a charge trapping layer.

One embodiment disclosed herein includes a method of operating non-volatile storage comprises the following. A group of non-volatile storage elements is erased. A set of the non-volatile storage elements in the group are programmed after erasing the group. An upper tail of an erase distribution of non-volatile storage elements in the set is determined in after the programming. An erase depth for erasing the group of non-volatile storage elements is determined based on the upper tail. The group of non-volatile storage elements are erased based on the established erase depth.

One embodiment disclosed herein includes a non-volatile storage device comprising a group of non-volatile storage elements and one or more managing circuits in communication with the group of non-volatile storage elements. The one or more managing circuits erase the group of non-volatile storage elements. The one or more managing circuits program a set of the non-volatile storage elements in the group after erasing the group. The one or more managing circuits determine an upper tail of an erase distribution of non-volatile storage elements in the set after the programming. The one or more managing circuits establish an erase depth for erasing the group of non-volatile storage elements based on the upper tail. The one or more managing circuits erase the group using the established erase depth.

One embodiment disclosed herein includes a non-volatile storage device comprising a group of non-volatile storage elements arranged as NAND strings, a plurality of word lines associated with the group of non-volatile storage elements, and one or more managing circuits in communication with the group of non-volatile storage elements. The one or more managing circuits erase the group of non-volatile storage elements. The one or more managing circuits program non-volatile storage elements in the group that are associated with a first word line of the plurality of word lines after erasing the group. The one or more managing circuits determine erase state to A-state fails of non-volatile storage elements in the group of non-volatile storage elements associated with the first word line after the programming. The one or more managing circuits establish an erase verify level for erasing the group of non-volatile storage elements based on the erase state to A-state fails. The one or more managing circuits erase the group based on the established erase verify level.

One embodiment disclosed herein includes a method of operating non-volatile storage that includes a group of non-volatile storage elements, the method comprises programming a set of the non-volatile storage elements in the group; determining how many program loops it takes to complete the programming; and establishing an erase depth for erasing the group of non-volatile storage elements based on how many program loops or a magnitude of a final programming voltage it takes to complete the programming.

One embodiment disclosed herein includes a 3D non-volatile storage device comprising a plurality of word lines layers, a plurality of insulator layers alternating with the word line layers in a stack, and a plurality of non-volatile storage element strings. Each non-volatile storage element string comprises a plurality of non-volatile storage elements. Each of the non-volatile storage elements is associated with one of the plurality of word lines. The device also has one or more managing circuits in communication with the group of non-volatile storage elements. The one or more managing circuits erase the group of non-volatile storage elements, the one or more managing circuits program a set of the non-volatile storage elements in the group after erasing the group. The one or more managing circuits determine an upper tail of an erase distribution of non-volatile storage elements in the set after the programming. The one or more managing circuits establish an erase depth for erasing the group of non-volatile storage elements based on the upper tail. The one or more managing circuits erase the group using the established erase depth.

Techniques for dynamically adjusted erased depth can be applied to a variety of types of memory cells, such as those having floating gates, as well as charge storage regions (e.g., ONO). Also, techniques for dynamically adjusting erase depth can be applied to a 2D architecture, as well as a 3D architecture, such as 3D NAND. 3D NAND may have vertical NAND strings. Examples discussed above are not intended to limit the invention to the precise form disclosed.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method of operating non-volatile storage, the method comprising:
    erasing a group of non-volatile storage elements;
    programming a set of the non-volatile storage elements in the group after erasing the group;
    determining an upper tail of an erase distribution of non-volatile storage elements in the set after the programming;
    establishing an erase depth for erasing the group of non-volatile storage elements based on the upper tail; and
    erasing the group of non-volatile storage elements based on the established erase depth.

2. The method of claim 1, wherein the establishing an erase depth for erasing the group of non-volatile storage elements based on the upper tail comprises:
    establishing a shallower erase depth when the upper tail is higher and a deeper erase depth when the upper tail is lower.

3. The method of claim 1, wherein the determining an upper tail of an erase distribution of non-volatile storage elements in the set after the programming comprises:
    determining erase-state to A-state fails of non-volatile storage elements in the set after the programming.

4. The method of claim 3, wherein the establishing an erase depth for erasing the group of non-volatile storage elements based on the upper tail comprises:
    establishing a shallower erase depth when the amount of erase state to A-state fails is higher and a deeper erase depth when an amount of erase state to A-state fails is lower.

5. The method of claim 1, wherein the determining an upper tail of an erase distribution of non-volatile storage elements in the set after the programming comprises:
    applying one or more reference voltages to gates of non-volatile storage elements in the set that were intended to be in an erased state after the programming, the one or more reference voltages are near an A-state read reference level;
    sensing whether the non-volatile storage elements in set that were intended to be in an erased state after the programming conduct a current in response to the respective reference voltages; and
    selecting the highest reference voltage for which the number of non-volatile storage elements in the set that were intended to be in the erased state that conduct a current is below a threshold number.

6. The method of claim 1, wherein erasing the group of non-volatile storage elements based on the established erase depth comprises:
    erasing the group of non-volatile storage elements using an erase verify level that is based on the erase depth.

7. The method of claim 1, wherein erasing the group of non-volatile storage elements based on the established erase depth comprises:
    erasing the group of non-volatile storage elements using a number of erase pulses after erase verify passes that depend on the erase depth.

8. The method of claim 1, wherein the programming a set of the non-volatile storage elements in the group comprises programming non-volatile storage elements associated with a first word line in a block, and further comprising:
    programming a second word line in the block after programming the first word line;
    storing information based on determining the upper tail of the erase distribution for the first word line, the information is stored in one or more non-volatile storage elements associated with the second word line when programming the second word line; and
    accessing the stored information from the one or more non-volatile storage elements associated with the second word line in order to establish the erase depth for erasing the group of non-volatile storage elements.

9. The method of claim 1, wherein the determining an upper tail of an erase distribution of non-volatile storage elements in the set after the programming comprises:
    performing a first read operation of the non-volatile storage elements in the set at a first reference level;

performing a second read operation of the non-volatile storage elements in the set at a second reference level; and determining how many of the non-volatile storage elements have a threshold voltage between the first reference level and the second reference level based on the first read operation and the second read operation.

10. A non-volatile storage device comprising:

a group of non-volatile storage elements; and one or more managing circuits in communication with the group of non-volatile storage elements, the one or more managing circuits erase the group of non-volatile storage elements, the one or more managing circuits program a set of the non-volatile storage elements in the group after erasing the group, the one or more managing circuits determine an upper tail of an erase distribution of non-volatile storage elements in the set after the programming, the one or more managing circuits establish an erase depth for erasing the group of non-volatile storage elements based on the upper tail, the one or more managing circuits erase the group using the established erase depth.

11. The non-volatile storage device of claim 10, wherein the one or more managing circuits establish a shallower erase depth when the upper tail is higher and a deeper erase depth when the upper tail is lower.

12. The non-volatile storage device of claim 10, wherein when the one or more managing circuits determine the upper tail of the erase distribution of non-volatile storage elements in the set after the programming, the one or more managing circuits determine erase state to A-state fails of non-volatile storage elements in the set after the programming, wherein the one or more managing circuits establish a more shallow erase depth when an amount of erase state to A-state fails is higher and a deeper erase depth when the amount of erase state to A-state fails is lower.

13. The non-volatile storage device of claim 10, wherein when the one or more managing circuits determine the upper tail of the erase distribution of non-volatile storage elements in the set after the programming, the one or more managing circuits perform one or more reads of non-volatile storage elements in set that were intended to be in an erased state after the programming at corresponding reference levels near an A-state read reference level, the one or more managing circuits determine the highest reference level for which the number of erase state to A-state fails is below a threshold number.

14. The non-volatile storage device of claim 10, wherein the one or more managing circuits save the established erase verify level in a block that is associated with the group of non-volatile storage elements for a future erase operation.

15. The non-volatile storage device of claim 10, wherein the group of non-volatile storage elements are part of a 3D memory array.

16. A non-volatile storage device comprising:

a group of non-volatile storage elements arranged as NAND strings;

a plurality of word lines associated with the group of non-volatile storage elements; and one or more managing circuits in communication with the group of non-volatile storage elements, the one or more managing circuits erase the group of non-volatile storage elements, the one or more managing circuits program non-volatile storage elements in the group that are associated with a first word line of the plurality of word lines after erasing the group, the one or more managing circuits determine erase state to A-state fails of non-volatile storage elements in the group of non-volatile storage elements associated with the first word line after the programming, the one or more managing circuits establish an erase verify level for erasing the group of non-volatile storage elements based on the erase state to A-state fails, the one or more managing circuits erase the group based on the established erase verify level.

17. The non-volatile storage device of claim 16, wherein the determining erase state to A-state fails of non-volatile storage elements comprises:

sensing non-volatile storage elements associated with the first word line that were intended to stay erased after the programming; and determining how many of the non-volatile storage elements that were to intended to stay erased have a threshold voltage that is above a read reference level of the A-state.

18. The non-volatile storage device of claim 16, wherein the determining erase state to A-state fails of non-volatile storage elements comprises:

sense non-volatile storage elements associated with the first word line that were intended to stay erased after the programming at a plurality of reference levels just above a read reference level of the A-state; and determine the highest of the plurality of reference levels for which the number of erase state to A-state fails is less than a threshold number.

19. A method of operating non-volatile storage that includes a group of non-volatile storage elements, the method comprising:

programming a set of the non-volatile storage elements in the group;

determining how many program loops or a magnitude of a final programming voltage it takes to complete the programming; and establishing an erase depth for erasing the group of non-volatile storage elements based on how many program loops or a magnitude of a final programming voltage it takes to complete the programming.

20. A 3D non-volatile storage device comprising:

a plurality of word line layers;

a plurality of insulator layers alternating with the word line layers in a stack;

a plurality of non-volatile storage element strings, each non-volatile storage element string comprises a plurality of non-volatile storage elements, each of the non-volatile storage elements is associated with one of the plurality of word line layers; and one or more managing circuits in communication with plurality of non-volatile storage elements, the one or more managing circuits erase a group of the non-volatile storage elements, the one or more managing circuits program a set of the non-volatile storage elements in the group after erasing the group, the one or more managing circuits determine an upper tail of an erase distribution of non-volatile storage elements in the set after the programming, the one or more managing circuits establish an erase depth for erasing the group of non-volatile storage elements based on the upper tail, the one or more managing circuits erase the group using the established erase depth.

* * * * *